(12) United States Patent
Funakubo et al.

(10) Patent No.: US 7,759,840 B2
(45) Date of Patent: Jul. 20, 2010

(54) ULTRASONIC MOTOR AND VIBRATION DETECTION METHOD FOR ULTRASONIC MOTOR

(75) Inventors: Tomoki Funakubo, Tokyo (JP); Nagahide Sakai, Tokyo (JP); Junji Okada, Tokyo (JP)

(73) Assignee: Olympus Corporation, Tokyo (JP)

( * ) Notice: Subject to any disclaimer, the term of this patent is extended or adjusted under 35 U.S.C. 154(b) by 287 days.

(21) Appl. No.: 11/890,121

(22) Filed: Aug. 3, 2007

(65) Prior Publication Data

US 2008/0036333 A1 Feb. 14, 2008

(30) Foreign Application Priority Data

Aug. 9, 2006 (JP) ............................. 2006-216710

(51) Int. Cl.
*H01L 41/047* (2006.01)
*H01L 41/09* (2006.01)
*H02N 2/04* (2006.01)

(52) U.S. Cl. ........................... 310/323.01; 310/323.16; 310/366

(58) Field of Classification Search ................................ 310/323.01–323.21, 328, 366
See application file for complete search history.

(56) References Cited

U.S. PATENT DOCUMENTS

| 6,051,911 | A | 4/2000 | Kojima et al. | |
| 7,075,211 | B1* | 7/2006 | Ganor et al. | 310/317 |
| 2004/0080243 | A1* | 4/2004 | Miyazawa | 310/328 |
| 2004/0239381 | A1* | 12/2004 | Matsuzaki et al. | 327/109 |

FOREIGN PATENT DOCUMENTS

JP 07-193291 7/1995

* cited by examiner

*Primary Examiner*—Walter Benson
*Assistant Examiner*—Derek J Rosenau
(74) *Attorney, Agent, or Firm*—Scully, Scott, Murphy & Presser, P.C.

(57) ABSTRACT

When a piezoelectric ceramic sheet is divided into two equal parts in a longitudinal direction and two equal parts in a width direction to form four regions, internal electrodes are disposed over each region and are disposed so that surface areas occupied in each region are substantially the same, and a longitudinal vibration is detected based on a potential difference between the internal electrodes.

2 Claims, 16 Drawing Sheets

FIG. 22
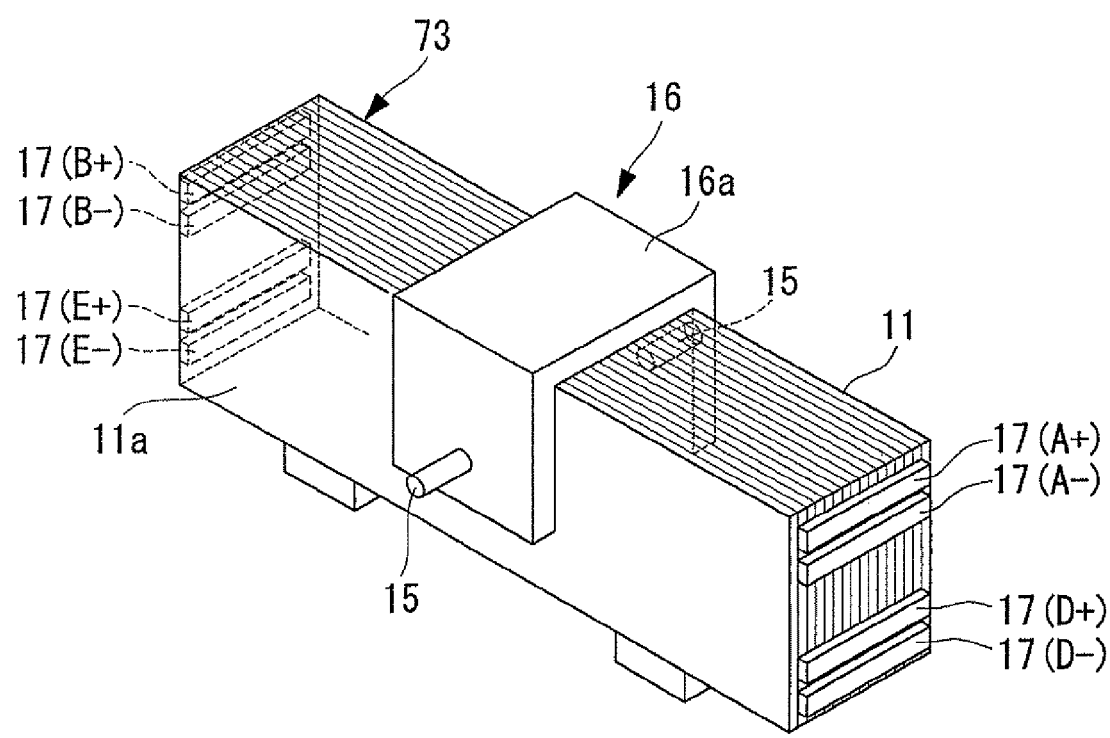
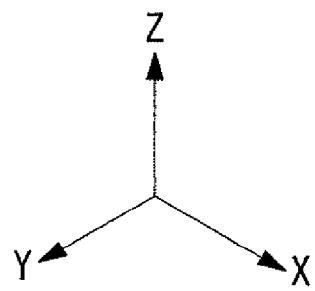

ULTRASONIC MOTOR AND VIBRATION DETECTION METHOD FOR ULTRASONIC MOTOR

BACKGROUND OF THE INVENTION

1. Field of the Invention

This invention relates to ultrasonic motors and to vibration detection methods for ultrasonic motors.

This application is based on Japanese Patent Application No. 2006-216710, the content of which is incorporated herein by reference.

2. Description of Related Art

Recently, ultrasonic motors have been drawing attention as a new type of motor replacing electromagnetic motors. Ultrasonic motors have the following advantages over known electromagnetic motors:

1) Ultrasonic motors are capable of high torque without using gears;
2) Ultrasonic motors have holding force when powered off;
3) Ultrasonic motors have high resolution;
4) Ultrasonic motors are quiet; and
5) Ultrasonic motors do not generate magnetic noise and are unaffected by noise.

A known ultrasonic motor is described in Japanese Unexamined Patent Application, Publication No. HEI-7-193291. In this ultrasonic motor, internal electrodes for detecting vibrations are provided on some layered piezoelectric elements, which enable vibrations to be detected.

However, the vibration which can be detected using the ultrasonic motor described in Japanese Unexamined Patent Application, Publication No. HEI-7-193291 is only a flexural vibration generated in a cylindrical rod-shaped vibrator. Accordingly, in a vibrator that simultaneously generates a longitudinal vibration and a flexural vibration, each vibration cannot be independently detected using the internal electrodes disclosed in Japanese Unexamined Patent Application, Publication No. HEI-7-193291; this is a problem because a separate, special device is thus required.

BRIEF SUMMARY OF THE INVENTION

It is an object of the present invention to provide an ultrasonic motor that can easily detect both a longitudinal vibration and a flexural vibration independently.

A first aspect of the present invention is an ultrasonic motor configured to simultaneously generate a longitudinal vibration and a flexural vibration in an ultrasonic vibrator in which a first piezoelectric element and a second piezoelectric element are alternately laminated, to generate a substantially elliptical vibration at an output end of the ultrasonic vibrator, thus causing the ultrasonic vibrator and a driven body in contact with the ultrasonic vibrator to move relative to each other. The ultrasonic motor includes a first internal electrode disposed, when the first piezoelectric element is divided into two equal parts in a longitudinal direction and two equal parts in a width direction to form four regions, in two neighboring regions or in all regions such that the surface areas occupied in each region are substantially the same; a second internal electrode disposed on the second piezoelectric element at a position corresponding to the first internal electrode; and a longitudinal vibration detection unit configured to detect the longitudinal vibration based on a potential difference between the first internal electrode and the second internal electrode.

With this configuration, when the first piezoelectric element is divided into two equal parts in the longitudinal direction and two equal parts in the width direction to form the four regions, the first internal electrode is disposed in two neighboring regions or in all regions so that the surface areas occupied in each region are substantially the same. Therefore, it is possible to detect only an electrical signal that is proportional to the longitudinal vibration. In other words, when a longitudinal vibration is excited in the ultrasonic vibrator, electrical charges of the same sign are excited in each of the four regions of the first piezoelectric element. In addition, when a flexural vibration is excited in the ultrasonic vibrator, electrical charges of the same sign are excited in regions that are diagonally opposite, and electrical charges of opposite sign are excited in neighboring regions. Therefore, the sum of electrical charge excited in the first internal electrode cancels out to zero in the flexural vibration, whereas in the longitudinal vibration, electrical charges of the same sign are excited in response to the vibration.

Furthermore, the second internal electrode is disposed on the second piezoelectric element at a position corresponding to the first internal electrode. Therefore, in a similar way, electrical charges of the same sign are excited in response to the longitudinal vibration. The electrical charges excited in the first internal electrode have opposite signs from the electrical charges excited in the second internal electrode. Therefore, by taking the difference (potential difference) between the electrical signal obtained from the first internal electrode and the electrical signal obtained from the second internal electrode, it is possible to detect the longitudinal vibration generated in the ultrasonic vibrator as an electrical signal.

A second aspect of the present invention is an ultrasonic motor configured to simultaneously generate a longitudinal vibration and a flexural vibration in an ultrasonic vibrator in which a first piezoelectric element and a second piezoelectric element are alternately laminated, to generate a substantially elliptical vibration at an output end of the ultrasonic vibrator, thus causing the ultrasonic vibrator and a driven body in contact with the ultrasonic vibrator to move relative to each other. The ultrasonic motor includes a first internal electrode disposed, when the first piezoelectric element is divided into two equal parts in a longitudinal direction and two equal parts in a width direction to form four regions, in one of the regions; a second internal electrode disposed in a neighboring region that neighbors the one region; a third internal electrode disposed on the second piezoelectric element in a region corresponding to the one region; a fourth internal electrode disposed on the second piezoelectric element in a region corresponding to the neighboring region; and a flexural vibration detection unit configured to detect the flexural vibration based on a difference between a sum of electrical charges excited in the first internal electrode and the fourth internal electrode and a sum of electrical charges excited in the second internal electrode and the third internal electrode.

With this configuration, when the first piezoelectric element is divided into two equal parts in the longitudinal direction and two equal parts in the width direction to form the four regions, the first internal electrode is disposed in one of the regions, and the second internal electrode is disposed in the neighboring region. In addition, the third internal electrode is disposed on the second piezoelectric element in a region corresponding to the one region, and the fourth internal electrode is disposed in a region corresponding to the neighboring region. When a longitudinal vibration is excited in the ultrasonic vibrator, electrical charges of the same sign are excited in the one region and the neighboring region, and when a flexural vibration is excited in the ultrasonic vibrator, electrical charges of opposite sign are excited in the one region and the neighboring region. Also, the sign of the electrical charges excited in each region on the second piezoelectric element are opposite to the sign of the electrical charges excited in each region corresponding to the first piezoelectric element. Therefore, regarding the sum of the electrical charges excited in the first internal electrode provided in the one region on the first piezoelectric element and the fourth internal electrode provided in the neighboring region on the second piezoelectric element, in the longitudinal vibration, the electrical charges cancel out to zero, whereas in the flexural vibration, electrical charges of the same sign are excited in response to the vibration.

In a similar way, regarding the sum of the electrical charges excited in the second internal electrode provided in the neighboring region on the first piezoelectric element and the third internal electrode provided in the one region on the second piezoelectric element, in the longitudinal vibration, the electrical charges cancel out to zero, whereas in the flexural vibration, electrical charges of the same sign are excited in response to the vibration. Thus, the sum of the electrical charges excited in the first and fourth internal electrodes is substantially the same as the sum of the electrical charges excited in the second and third internal electrodes, but with opposite sign. Therefore, by taking the difference, that is to say, the potential difference, between them, it is possible to detect the flexural vibration as an electrical signal.

A third aspect of the present invention is an ultrasonic motor configured to simultaneously generate a longitudinal vibration and a flexural vibration in an ultrasonic vibrator in which a first piezoelectric element and a second piezoelectric element are alternately laminated, to generate a substantially elliptical vibration at an output end of the ultrasonic vibrator, thus causing the ultrasonic vibrator and a driven body in contact with the ultrasonic vibrator to move relative to each other. The ultrasonic motor includes a first internal electrode disposed, when the first piezoelectric element is divided into two equal parts in a longitudinal direction and two equal parts in a width direction to form four regions, in one of the regions; a second internal electrode disposed in a neighboring region that neighbors the one region; a third internal electrode disposed on the second piezoelectric element in a region corresponding to the one region; a fourth internal electrode disposed on the second piezoelectric element in a region corresponding to the neighboring region; a first vibration detection unit configured to generate a first vibration detection signal based on a potential difference between the first internal electrode and the third internal electrode; a second vibration detection unit configured to generate a second vibration detection signal based on a potential difference between the second internal electrode and the fourth internal electrode; and a third vibration detection unit configured to detect the longitudinal vibration by summing the first vibration detection signal and the second vibration detection signal and configured to detect the flexural vibration by taking the difference of the first vibration detection signal and the second vibration detection signal.

According to this configuration, when the first piezoelectric element is divided into two equal parts in the longitudinal direction and two equal parts in the width direction to form the four regions, the first internal electrode is disposed in the one region, and the second internal electrode is disposed in the neighboring region. Also, the third internal electrode is disposed on the second piezoelectric element in the region corresponding to the one region, and the fourth internal electrode is disposed in the region corresponding to the neighboring region. When a longitudinal vibration is excited in the ultrasonic vibrator, electrical charges of the same sign are excited in the one region and the neighboring region, and when a flexural vibration is excited in the ultrasonic vibrator, electrical charges of opposite sign are excited in the one region and the neighboring region. In addition, the signs of the electrical charges excited in each region on the second piezoelectric element are opposite to the signs of the electrical charges excited in each region on the first piezoelectric element.

Therefore, by adding the potential difference between the first and fourth internal electrodes and the potential difference between the second and third internal electrodes, it is possible to obtain a vibration detection signal that is proportional to the longitudinal vibration, and by taking the difference between the potential difference between the first and fourth internal electrodes and the potential difference between the second and third internal electrodes, it is possible to obtain a vibration detection signal that is proportional to the flexural vibration.

A fourth aspect of the present invention is a vibration detection method for an ultrasonic motor configured to simultaneously generate a longitudinal vibration and a flexural vibration in an ultrasonic vibrator in which a first piezoelectric element and a second piezoelectric element are alternately laminated, to generate a substantially elliptical vibration at an output end of the ultrasonic vibrator, thus causing the ultrasonic vibrator and a driven body in contact with the ultrasonic vibrator relative to each other. The vibration detection method for the ultrasonic motor includes disposing, when the first piezoelectric element is divided into two equal parts in a longitudinal direction and two equal parts in a width direction to form four regions, a first internal electrode in two neighboring regions or in all regions such that surface areas occupied in each region are substantially the same; disposing a second internal electrode on the second piezoelectric element at a position corresponding to the first internal electrode; and detecting the longitudinal vibration based on a potential difference between the first internal electrode and the second internal electrode.

A fifth aspect of the present invention is a vibration detection method for an ultrasonic motor configured to simultaneously generate a longitudinal vibration and a flexural vibration in an ultrasonic vibrator in which a first piezoelectric element and a second piezoelectric element are alternately laminated, to generate a substantially elliptical vibration at an output end of the ultrasonic vibrator, thus causing the ultrasonic vibrator and a driven body in contact with the ultrasonic vibrator to move relative to each other. The vibration detection method for the ultrasonic motor includes disposing, when the first piezoelectric element is divided into two equal parts in a longitudinal direction and two equal parts in a width direction to form four regions, a first internal electrode in one of the regions, and disposing a second internal electrode in a neighboring region that neighbors the one region; disposing a third internal electrode on the second piezoelectric element in a region corresponding to the one region, and disposing a fourth internal electrode in a region corresponding to the neighboring region; and detecting the flexural vibration based on a difference between a sum of electrical charges excited in the first internal electrode and the fourth internal electrode and a sum of electrical charges excited in the second internal electrode and the third internal electrode.

A sixth aspect of the present invention is a vibration detection method for an ultrasonic motor configured to simultaneously generate a longitudinal vibration and a flexural vibration in an ultrasonic motor in which a first piezoelectric element and a second piezoelectric element are alternately laminated, to generate a substantially elliptical vibration at an output end of the ultrasonic vibrator, thus causing the ultrasonic vibrator and a driven body in contact with the ultrasonic vibrator to move relative to each other. The vibration detection method for the ultrasonic motor includes disposing, when the first piezoelectric element is divided into two equal parts in a longitudinal direction and two equal parts in a width direction to form four regions, a first internal electrode in one of the regions, and disposing a second internal electrode in a neighboring region that neighbors the one region; disposing a third internal electrode on the second piezoelectric element in a region corresponding to the neighboring region, and disposing a fourth internal electrode in a region corresponding to the neighboring region; generating a first vibration detection signal based on a potential difference between the first internal electrode and the third internal electrode; generating a second vibration detection signal based on a potential difference between the second internal electrode and the fourth internal electrode; and detecting the longitudinal vibration by summing the first vibration detection signal and the second vibration detection signal, and detecting the flexural vibration by taking the difference between the first vibration detection signal and the second vibration detection signal.

A seventh aspect of the present invention is an ultrasonic motor configured to simultaneously generate a longitudinal vibration and a flexural vibration in an ultrasonic vibrator in which a first piezoelectric element and a second piezoelectric element are alternately laminated, to generate a substantially elliptical vibration at an output end of the ultrasonic vibrator, thus causing the ultrasonic vibrator and a driven body in contact with the ultrasonic vibrator to move relative to each other. The ultrasonic motor includes a longitudinal vibration detection unit configured to output a longitudinal vibration detection signal that is proportional to the longitudinal vibration; a flexural vibration detection unit configured to output a flexural vibration detection signal that is proportional to the flexural vibration; and a signal control unit configured to detect a phase difference between the longitudinal vibration detection signal and the flexural vibration detection signal and to control the phase of two-phase driving AC voltages applied to the ultrasonic vibrator so that the phase difference becomes a prescribed reference phase difference that is set in advance.

With this configuration, the longitudinal vibration detection signal that is proportional to the longitudinal vibration generated in the ultrasonic vibrator and the flexural vibration detection signal that is proportional to the flexural vibration are separately detected, and the phase difference between the two-phase driving AC voltages applied to the ultrasonic vibrator is controlled so that the phase difference between these vibration detection signals becomes the prescribed reference phase difference. Therefore, when the phase difference between the longitudinal vibration and the flexural vibration generated in the ultrasonic vibrator changes due to a disturbance in the motor load or the like, it is possible to quickly adjust the two-phase driving AC voltages to track such a change. Accordingly, it is possible to keep the phase difference between the longitudinal vibration and the flexural vibration generated in the ultrasonic vibrator at a constant value, thus allowing stable motor driving to be realized.

In the ultrasonic motor described above, the signal control unit may detect the phase difference between one of the driving AC voltages and either the longitudinal vibration detection signal or the flexural vibration detection signal and may control the frequency of each driving AC voltage so that the phase difference becomes a prescribed value.

With this configuration, the phase difference between one of the driving AC voltages and either the longitudinal vibration detection signal or the flexural vibration detection signal is detected, and the frequencies of the two-phase driving AC voltages are controlled so that this phase difference becomes the prescribed value. Accordingly, even if there is a shift in the frequency characteristics due to a change in environmental temperature, it is possible to quickly make the driving frequencies track such a change in environmental temperature. As a result, it is possible to keep the driving efficiency of the motor constant, which allows stable motor driving to be realized.

In the ultrasonic motor described above, preferably, the ultrasonic vibrator includes a first piezoelectric element and a second piezoelectric element, which are alternately laminated; and the longitudinal vibration detection unit includes a first internal electrode disposed, when the first piezoelectric element is divided into two equal parts in a longitudinal direction and two equal parts in a width direction to form four regions, in two neighboring regions or in all regions, such that surface areas occupied in each region are substantially the same, and a second internal electrode disposed on the second piezoelectric element at a position corresponding to the first internal electrode; and detects the longitudinal vibration based on a potential difference between the first internal electrode and the second internal electrode.

With this configuration, it is possible to easily detect the longitudinal vibration.

In the ultrasonic motor described above, preferably, the ultrasonic vibrator includes a first piezoelectric element and a second piezoelectric element, which are alternately laminated; and the flexural vibration detection unit includes a first internal electrode disposed, when the first piezoelectric element is divided into two equal parts in a longitudinal direction and two equal parts in a width direction to form four regions, in one of the regions, a second internal electrode disposed in a neighboring region that neighbors the one region, a third internal electrode disposed on the second piezoelectric element in a region corresponding to the one region, and a fourth internal electrode disposed on the second piezoelectric element in a region corresponding to the neighboring region; and detects the flexural vibration based on a difference between a sum of electrical charges excited in the first internal electrode and the fourth internal electrode and a sum of electrical charges excited in the second internal electrode and the third internal electrode.

With this configuration, it is possible to easily detect the flexural vibration.

An eighth aspect of the present invention is an ultrasonic motor configured to simultaneously generate a longitudinal vibration and a flexural vibration in an ultrasonic vibrator in which a first piezoelectric element and a second piezoelectric element are alternately laminated, to generate a substantially elliptical vibration at an output end of the ultrasonic vibrator, thus causing the ultrasonic vibrator and a driven body in contact with the ultrasonic vibrator to move relative to each other. The ultrasonic motor includes a first internal electrode disposed, when the first piezoelectric element is divided into two equal parts in a longitudinal direction and two equal parts in a width direction to form four regions, in one of the regions; a second internal electrode disposed in a neighboring region that neighbors the one region; a third internal electrode disposed on the second piezoelectric element in a region corresponding to the one region; a fourth internal electrode disposed on the second piezoelectric element in a region corresponding to the neighboring region; a first vibration detection unit configured to generate a first vibration detection signal based on a potential difference between the first internal electrode and the third internal electrode; a second vibration detection unit configured to generate a second vibration detection signal based on a potential difference between the second internal electrode and the fourth internal electrode; a third vibration detection unit configured to detect the longitudinal vibration by summing the first vibration detection signal and the second vibration detection signal, and configured to detect the flexural vibration by taking the difference between the first vibration detection signal and the second vibration detection signal; and a signal control unit configured to detect a phase difference between the longitudinal vibration detection signal and the flexural vibration detection signal and to control the phases of two-phase driving AC voltages applied to the ultrasonic vibrator so that the phase difference becomes a prescribed reference phase difference that is set in advance.

In the ultrasonic motor described above, the signal control unit may detect the phase difference between one of the driving AC voltages and either the longitudinal vibration detection signal or the flexural vibration detection signal and may control the frequency of each driving AC voltage so that the phase difference becomes a prescribed value.

The aspects described above may be combined in various possible ways.

According to this invention, an advantage is afforded in that it is possible to easily detect both a longitudinal vibration and a flexural vibration independently.

BRIEF DESCRIPTION OF THE SEVERAL VIEWS OF THE DRAWINGS

FIG. 22 is a perspective view of an ultrasonic vibrator formed by laminating the piezoelectric ceramic sheets shown in FIG. 20 and 21.

DETAILED DESCRIPTION OF THE INVENTION

An ultrasonic motor according to an embodiment of the present invention will be described below with reference to the drawings.

First Embodiment

Figure 1:
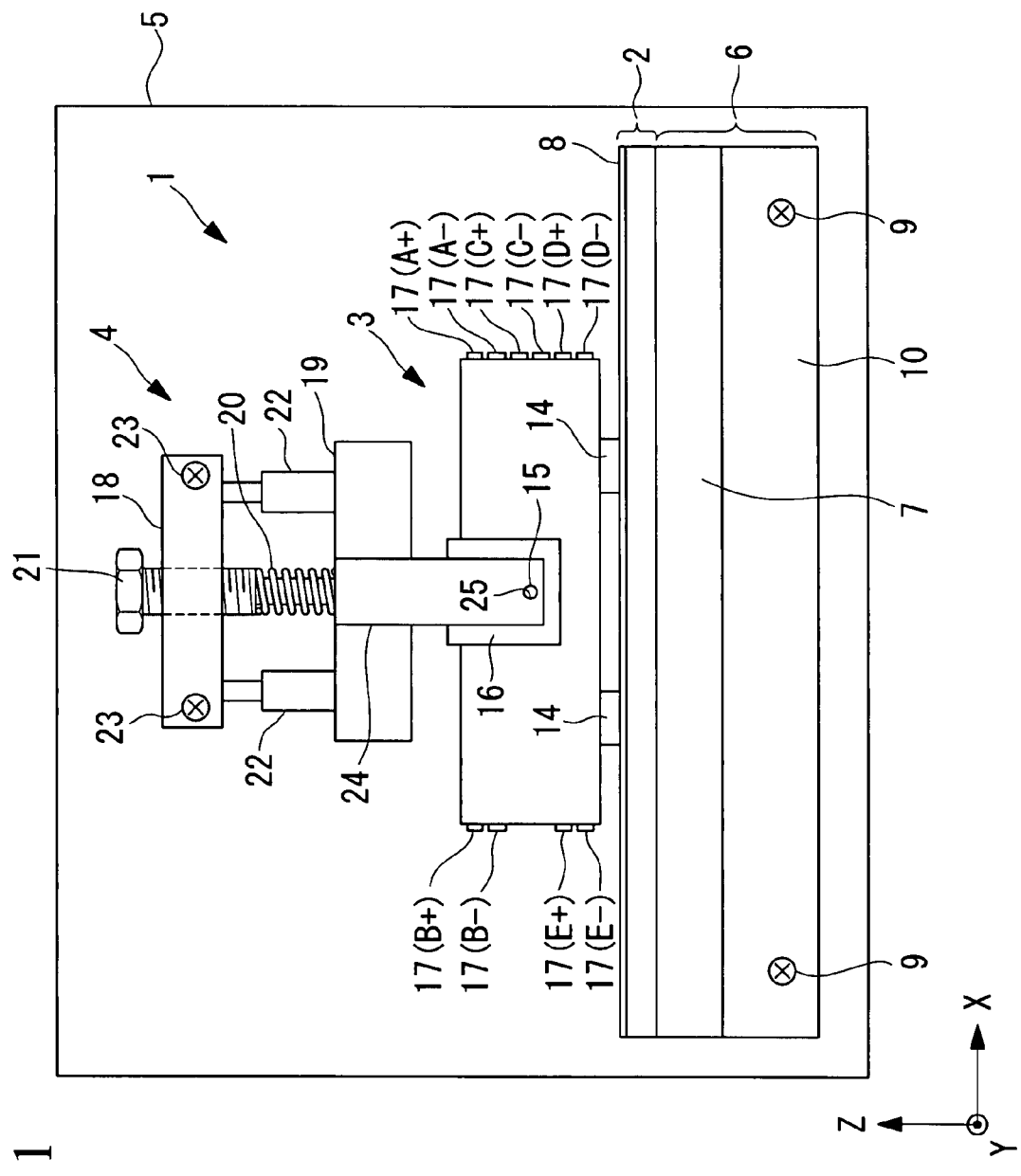
FIG. 1 is a diagram showing the overall configuration of an ultrasonic motor according to a first embodiment of the present invention.

As shown in FIG. 1, an ultrasonic motor 1 according to the first embodiment of the present invention includes an ultrasonic vibrator 3 disposed in contact with a driven body 2, and a pressing unit 4 for pressing the ultrasonic vibrator 3 against the driven body 2. The driven body 2 is fixed to a movable member 7 of a linear bearing 6, which is secured to a base 5. A sliding plate 8 made of, for example, zirconia ceramic is bonded to the driven body 2 on the surface contacting the ultrasonic vibrator 3. Screws 9 secure a fixed member 10 of the linear bearing 6 to the base 5.

As shown in FIGS. 2 to 5, the ultrasonic vibrator 3 includes a rectangular-block-shaped piezoelectric layered member 13, two friction-contact members (output terminals) 14 bonded to one side surface of the piezoelectric layered member 13, and a vibrator holding member 16. The piezoelectric layered member 13 is made up of a stack of rectangular piezoelectric ceramic sheets (piezoelectric elements) 11. On one side of each of the piezoelectric ceramic sheets 11, sheets of inner electrodes 12 are provided (refer to FIG. 4). The vibrator holding member 16 has pins 15 projecting from side surfaces adjacent to the side surface on which the friction-contact members 14 are provided.

Figure 3:
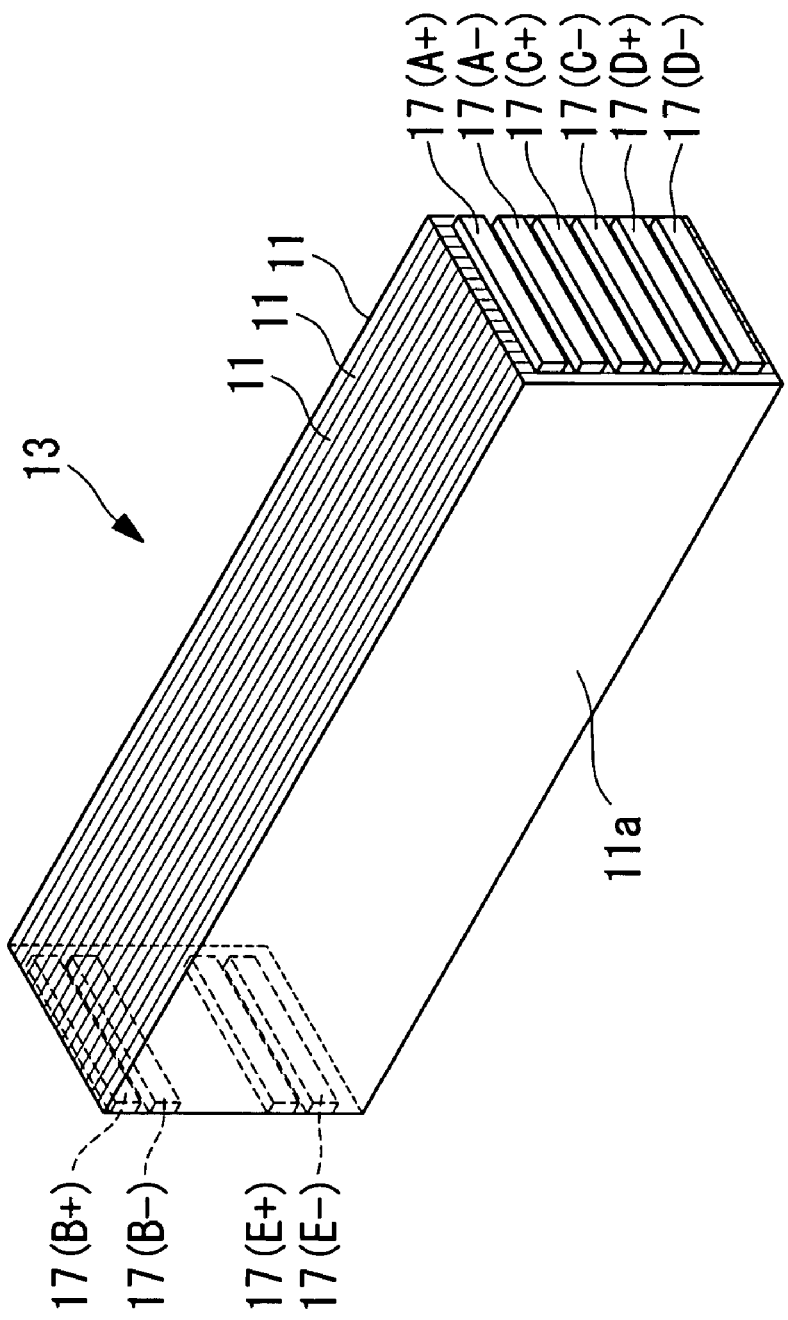
FIG. 3 is a perspective view showing a piezoelectric layered member constituting the ultrasonic vibrator in FIG. 2.

As shown in FIG. 3, the outer dimensions of the piezoelectric layered member 13 are, for example, a length of 18 mm, a width of 4.4 mm, and a thickness of 2 mm.

Figure 4:
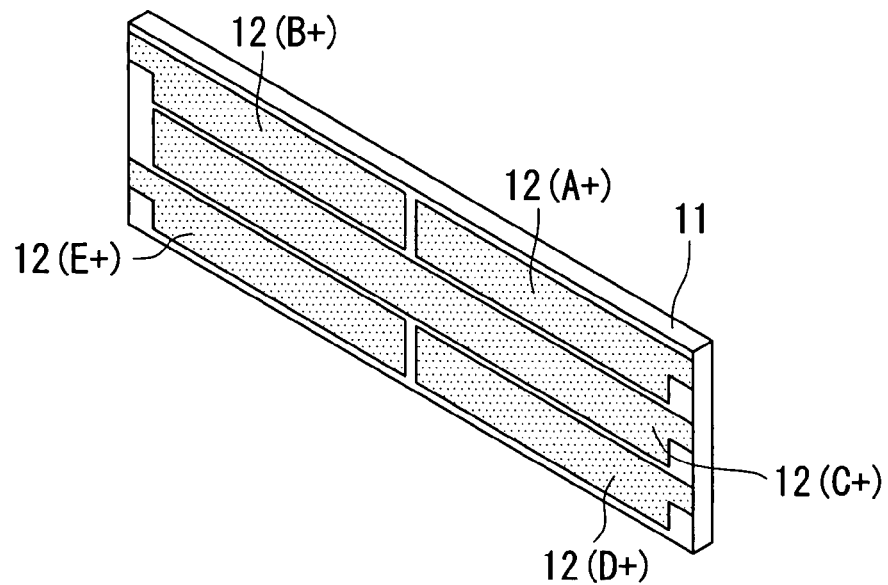
FIG. 4 is a perspective view showing a piezoelectric ceramic sheet constituting the piezoelectric layered member in FIG. 3.
Figure 5:
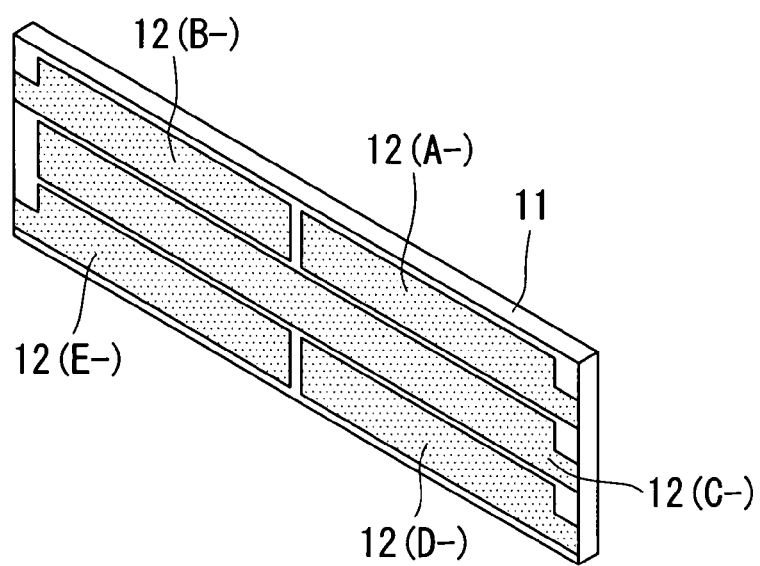
FIG. 5 is a perspective view showing a piezoelectric ceramic sheet constituting the piezoelectric layered member in FIG. 3.

As shown in FIGS. 4 and 5, the piezoelectric ceramic sheets 11 constituting the piezoelectric layered member 13 are, for example, lead zirconate titanate piezoelectric ceramic elements (hereinafter referred to as PZT) having a thickness of about 80 μm. For the PZT, a hard-type PZT having a large Qm value is selected. The Qm value is about 1,800.

The inner electrodes 12, for example, are composed of silver-palladium alloy and have a thickness of about 4 μm. A piezoelectric ceramic sheet 11a (see FIG. 2) disposed at one end in the layering direction does not have any inner electrodes 12. The other piezoelectric ceramic sheets 11 include two different types of inner electrodes 12. The two different types of inner electrodes 12 are illustrated in FIGS. 4 and 5.

The piezoelectric ceramic sheet (first piezoelectric element) 11 shown in FIG. 4 includes the internal electrode 12 on substantially the entire surface thereof. The internal electrode 12 is divided into internal electrodes 12(A+) and 12(B+) for driving and internal electrodes 12(C+), 12(D+), and 12(E+) for vibration detection.

In this embodiment, the internal electrode 12(C+) is used for detecting the longitudinal vibration, and the internal electrodes 12(D+) and 12(E+) are used for detecting the flexural vibration.

Figure 8:
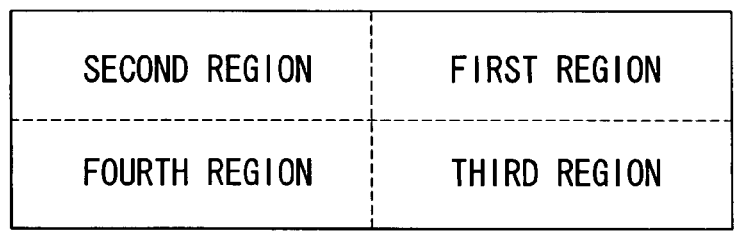
FIG. 8 is a diagram for explaining electrical charges generated in internal electrodes provided on the ceramic sheet, where the ceramic sheet is divided into four regions.

The internal electrode 12(C+) is provided in the form of a strip along the longitudinal direction of the piezoelectric ceramic sheet 11, at the center in the width direction of the piezoelectric ceramic sheet 11. More specifically, when the piezoelectric ceramic sheet 11 is divided into two equal parts in the longitudinal direction and into two equal parts in the width direction to be partitioned into four regions, that is, first to fourth regions, as shown in FIG. 8, the internal electrode 12(C+) for detecting the longitudinal vibration is disposed so that the areas occupied by the first to fourth regions are substantially the same.

Instead of the arrangement described above, the internal electrode 12(C+) may be disposed so that, of the four regions, the areas occupied by two prescribed neighboring regions may be substantially equal, and the areas occupied by the other two neighboring regions may be substantially equal. For example, the internal electrode 12(C+) may be disposed so that the first region and the second region occupy the same surface area, and the third region and the fourth region occupy the same surface area. In this case, the first region and the third region may occupy different surface areas. In addition, instead of placing the internal electrode 12(C+) over the four regions, the internal electrode 12(C+) may be placed over two neighboring regions. For example, the internal electrode 12(C+) may be disposed over the third region and the fourth region so that the surface areas occupied in each region are substantially the same.

When the piezoelectric ceramic sheet 11 is divided into four regions in the same way, the internal electrode 12(D+) for detecting the flexural vibration is provided in any one region. In this embodiment, the internal electrode 12(D+) is provided in the third region shown in FIG. 8. The internal electrode 12(E+) is provided in the region neighboring the region where the internal electrode 12(D+) is provided, that is, in the fourth region shown in FIG. 8 in this embodiment. It may be disposed in the first region instead of in the fourth region.

The internal electrodes 12(A+) and 12(B+) for driving are disposed in a row extending in the longitudinal direction of the piezoelectric ceramic sheet 11. In this embodiment, the internal electrode 12(A+) is disposed in the first region shown in FIG. 8, and the internal electrode 12(B+) is disposed in the second region.

Similarly, the piezoelectric ceramic sheet (second piezoelectric element) 11 shown in FIG. 5 includes the internal electrode 12 on substantially the entire surface thereof. The internal electrode 12 is divided into internal electrodes 12(A−) and 12(B−) for driving and internal electrodes 12(C−), 12 (D−), and 12(E−) for vibration detection.

The internal electrode 12(C−) is used for detecting the longitudinal vibration, and the internal electrodes 12(D−) and 12(E−) are used for detecting the flexural vibration.

The internal electrode 12(C−) is disposed on the piezoelectric ceramic sheet 11 shown in FIG. 5 at a position corresponding to the internal electrode 12(C+) on the piezoelectric ceramic sheet 11 shown in FIG. 4. Similarly, the internal electrodes 12(D−) and 12(E−) are disposed at positions corresponding to the internal electrodes 12(D+) and 12(E+) shown in FIG. 4.

The internal electrodes 12 are disposed so as to be separated from each other by insulating distances of about 0.4 mm in the width direction of the piezoelectric ceramic sheet 11 and are separated from each other by insulating distances of about 0.4 mm in the longitudinal direction of the piezoelectric ceramic sheet 11.

The internal electrodes 12(C+) and 12(C−) provided in the shape of strips at the center of the piezoelectric ceramic sheets 11 both have substantially the same size. The eight internal electrodes 12(A+), 12(B+), 12(D+), 12(E+), 12(A−), 12(B−), 12(D−), and 12(E−) disposed around the internal electrodes 12(C+) and 12(C−) have substantially the same size.

The internal electrodes 12 are disposed so as to be separated by a gap of about 0.4 mm from the circumferential edge of the piezoelectric ceramic sheet 11, and one end thereof extends to the circumferential edge of the piezoelectric ceramic sheet 11 to be connected to external electrodes 17, which are described later.

The rectangular-block-shaped piezoelectric layered member 13 is formed by alternately laminating a plurality of the piezoelectric ceramic sheets 11 shown in FIG. 4 and the piezoelectric ceramic sheets 11 shown in FIG. 5.

External electrodes 17 for respectively connecting the same types of electrodes of the internal electrodes 12(A+) to 12(E−) disposed on the piezoelectric ceramic sheets 11 are provided on end faces in the longitudinal direction of the piezoelectric layered member 13 formed as described above. More specifically, at one end in the longitudinal direction of the piezoelectric layered member 13, A-phase external electrodes 17(A+) and 17(A−), C-phase external electrodes 17(C+) and 17(C−), and D-phase external electrodes 17(D+) and 17(D−) are disposed in this order from the other side face of the piezoelectric layered member 13 (the upper side in the figure). On the opposite face thereto, B-phase external electrodes 17(B+) and 17(B−) and E-phase external electrodes 17(E+) and 17(E−) are provided in this order from the top in the drawing.

The A-phase and B-phase external electrodes 17 are driving external electrodes, and the C-phase and E-phase external electrodes 17 are vibration-detection external electrodes. Each external electrode is connected to a wiring line. Any kind of wiring line may be used, such as lead lines or flexible substrates, so long as it is flexible.

Figure 11:
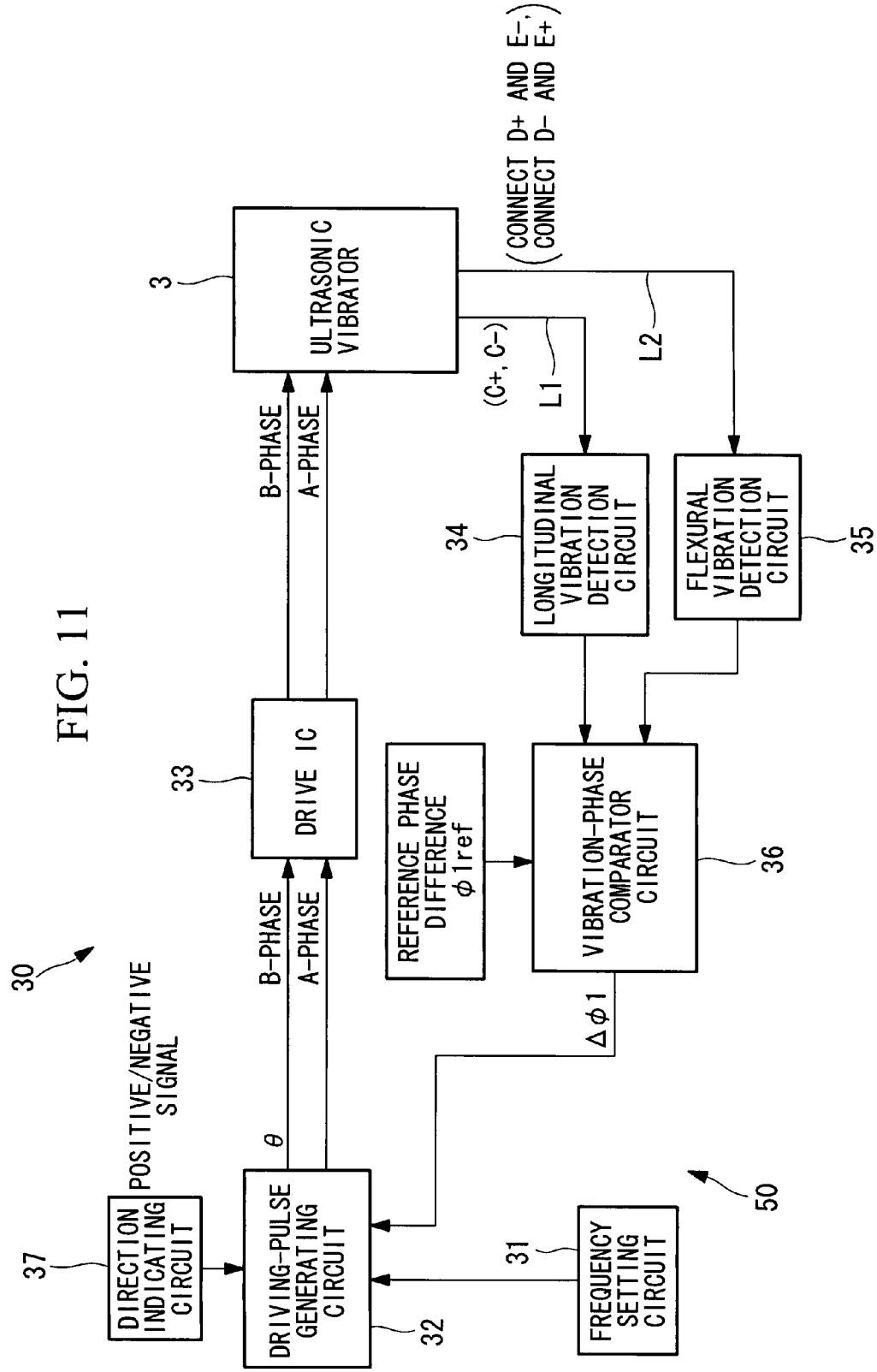
FIG. 11 is a block diagram showing, in outline, the configuration of a control unit according to a first embodiment of the present invention.

More specifically, a pair of wiring lines respectively connected to the A-phase external electrodes 17(A+) and 17(A−) and a pair of wiring lines respectively connected to the B-phase external electrodes 17(B+) and 17(B−) serve as A-phase and B-phase driving signal lines that are connected to a drive IC 33 in the control unit 30 shown in FIG. 11.

A pair of wiring lines L1 respectively connected to the C-phase external electrodes 17(C+) and 17(C−) are connected to a longitudinal vibration detection circuit 34 in the control unit 30 shown in FIG. 11.

After joining the wiring lines connected to the external electrodes 17(D+) and 17(E−) to form a single wiring line and joining the wiring lines connected to the external electrodes 17(D−) and 17(E+) to form a single wiring line, they are connected to a flexural vibration detection circuit 34 in the control unit 30 shown in FIG. 11 as a pair of wiring lines L2.

Next, the operation of the piezoelectric layered member 13 configured as described above will be explained.

Figure 6:
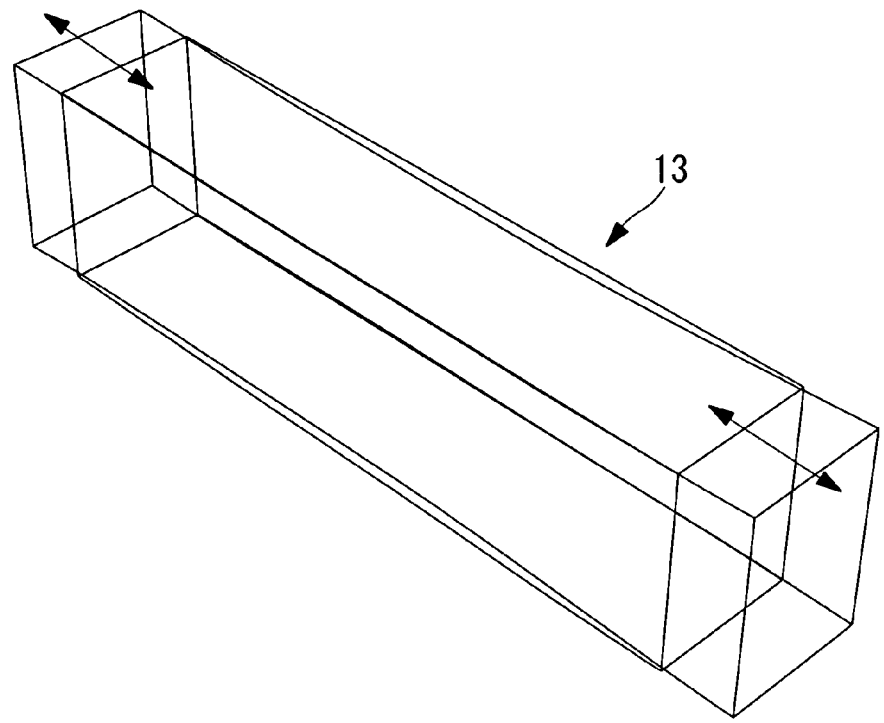
FIG. 6 is a diagram illustrating vibration of the piezoelectric layered member in FIG. 2 in a first-order longitudinal vibration, obtained by computer analysis.
Figure 9:
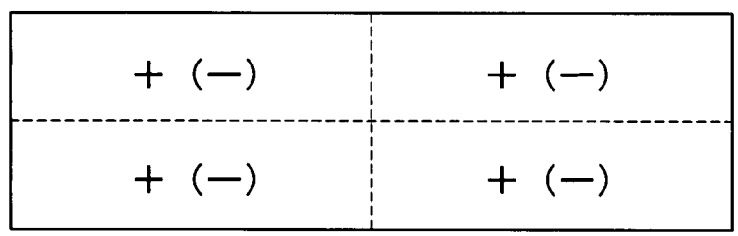
FIG. 9 is a diagram showing the electrical charges excited in each region shown in FIG. 8 when the longitudinal vibration is excited.

When driving AC voltages corresponding to the resonance frequency are applied with the same phase to the A-phase external electrodes 17(A+, A−) (hereinafter referred to simply as "A-phase") and the B-phase external electrodes 17(B+, B−) (hereinafter referred to simply as "B-phase"), a first-order longitudinal vibration is excited, as shown in FIG. 6. At this time, when the piezoelectric ceramic sheet 11 described above is divided into four regions, as shown for example in FIG. 8, the electrical charges generated in the piezoelectric ceramic sheet 11 are simultaneously either all positive electrical charges or all negative electrical charges in the first to fourth regions, as shown in FIG. 9.

Figure 7:
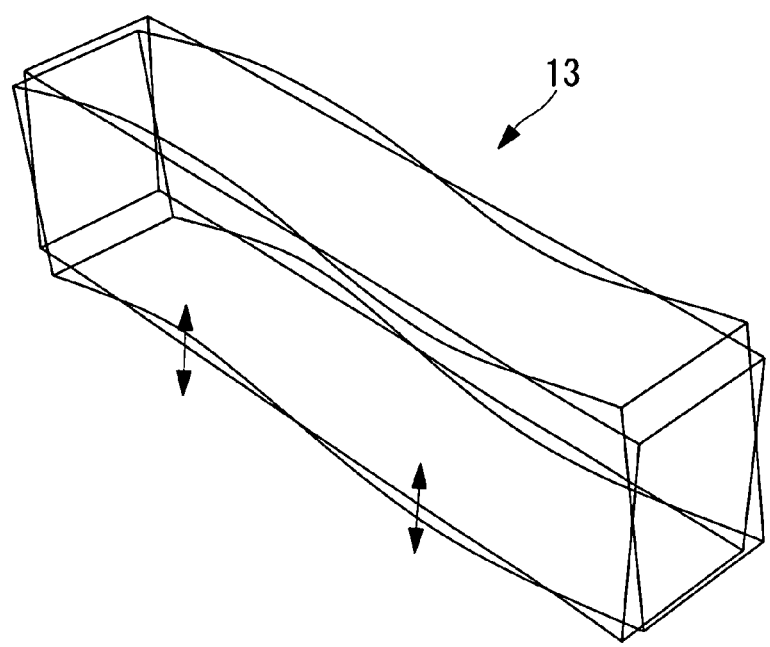
FIG. 7 is a diagram illustrating vibration of the piezoelectric layered member in FIG. 2 in a second-order flexural vibration, obtained by computer analysis.
Figure 10:
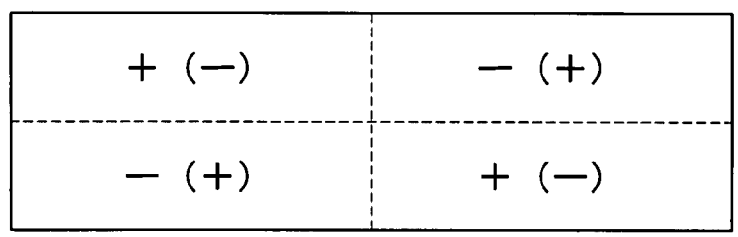
FIG. 10 is a diagram showing the electrical charges excited in each region shown in FIG. 8 when the flexural vibration is exited.

By applying driving AC voltages corresponding to the resonant frequencies and having opposite phases to the A-phase and B-phase external electrodes 17, a second-order flexural vibration is excited, as illustrated in FIG. 7. The electrical charges in each region at this time are as shown in FIG. 10. In other words, when the flexural vibration is excited, among the first to fourth regions, electrical charges of the same sign are simultaneously excited in the regions that are located diagonally opposite, that is, the first and fourth regions and the second and third regions, and electrical charges of opposite sign are simultaneously excited in neighboring regions, that is, in the first and second regions, the second and fourth regions, the fourth and third regions, and the third and first regions.

Electrical charges of mutually opposite signs are excited in the internal electrodes 12 forming pairs. In other words, electrical charges of mutually opposite signs are excited in the internal electrodes 12(C+) and 12(C−), the internal electrodes 12(D+) and 12(D−), and the internal electrodes 12(E+) and 12(E−).

From the above behavior, in the C-phase internal electrodes 12(C+) and 12(C−), which are disposed so as to be uniformly distributed with respect to neighboring regions, the electrical charges due to the flexural vibration cancel each other out, and electrical charges proportional to only the longitudinal vibration are excited. Therefore, the electrical signal detected via the pair of C-phase wiring lines L1 is proportional to the longitudinal vibration. The sign of the electrical charges excited is determined by the phase of the vibration.

In the internal electrodes 12(D+) and 12(E−), the electrical charges due to the longitudinal vibration cancel out, and electrical charges proportional to only the flexural vibration are excited. Similarly, in the internal electrodes 12(D−) and 12(E+), the electrical charges due to the longitudinal vibration cancel out, and electrical charges proportional to only the flexural vibration are excited. Therefore, the electrical signal detected via the pair of wiring lines L2 is proportional to the flexural vibration. The sign of the electrical charges excited is determined by the phase of the vibration.

The friction-contact members 14 are bonded on the piezoelectric layered member 13 at two positions corresponding to the antinodes of the second-order flexural vibration. In this way, the friction-contact members 14 are displaced in the longitudinal direction of the piezoelectric layered member 13 (that is, the X direction in FIG. 2) when a first-order longitudinal vibration is generated in the piezoelectric layered member 13. On the other hand, the friction-contact members 14 are displaced in the width direction of the piezoelectric layered member 13 (that is, the Z direction in FIG. 2) when a second-order flexural vibration is generated in the piezoelectric layered member 13.

Consequently, by applying phase-shifted driving AC voltages corresponding to the resonant frequencies to the A-phase and B-phase external electrodes 17 of the ultrasonic vibrator 3, the first-order longitudinal vibration and the second-order flexural vibration are generated simultaneously. As a result, substantially elliptical vibrations in a clockwise or counter-clockwise direction are generated at the friction-contact members 14, as indicated by the arrows C in FIG. 2.

Figure 2:
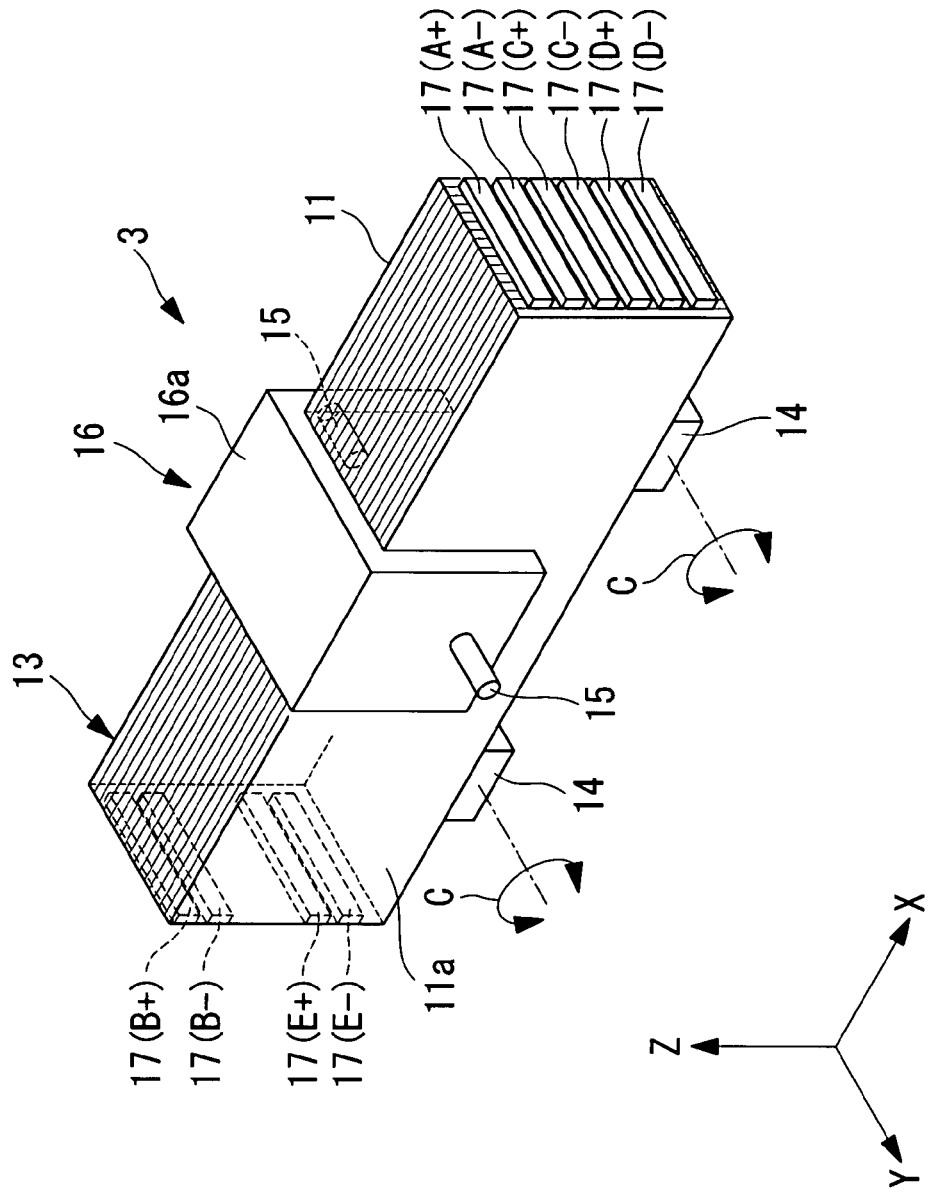
FIG. 2 is a perspective view showing an ultrasonic vibrator of the ultrasonic motor in FIG. 1.

As shown in FIG. 2, the vibrator holding member 16 includes a holding part 16a having a substantially angular-U shape in cross section and the pins 15, integral with the holding part 16a, which project perpendicularly from both sides of the holding part 16a. The holding part 16a covers the piezoelectric layered member 13 from one side in the width direction thereof and is bonded to the piezoelectric layered member 13 with, for example, a silicone resin or an epoxy resin. When the holding part 16a is bonded to the piezoelectric layered member 13, the two pins 15 integrally provided on the sides of the holding part 16a are coaxially disposed at the position of a common node of the longitudinal vibration and the flexural vibration of the piezoelectric layered member 13.

The pressing unit 4, as illustrated in FIG. 1, includes a bracket 18, a pressing unit 19, a coil spring 20, an adjustment screw 21, and guiding bushes 22. The bracket 18 is fixed on the base 5 with screws 23 at a position a predetermined distance away from the ultrasonic vibrator 3 in the width direction (Z direction) on the opposite side of the ultrasonic vibrator 3 from the friction-contact members 14. The pressing unit 19 is supported so that it is movable in the width direction of the ultrasonic vibrator 3 with respect to the bracket 18. The coil spring 20 applies a pressing force to the pressing unit 19, and the adjustment screw 21 adjusts the pressing force. The guiding bushes 22 guide the movement of the pressing unit 19 with respect to the bracket 18. Reference numeral 23 is a screw for securing the bracket 18 to the base 5.

The pressing unit 19 includes two support plates 24 sandwiching the ultrasonic vibrator 3 in the thickness direction thereof. The support plates 24 each have a through-hole 25 for passing the two pins 15 of the vibrator holding member 16. The pressing force applied to the pressing unit 19 is transmitted to the ultrasonic vibrator 3 through the support plates 24 and the pins 15 passing through the through-holes 25.

The coil spring 20 is a compression coil spring interposed between the adjustment screw 21 and the pressing unit 19. By changing the fastening position of the adjustment screw 21 with respect to the bracket 18, the amount of elastic deformation of the coil spring 20 is changed so as to change the pressing force applied to the pressing unit 19 in a direction toward the ultrasonic vibrator 3.

Next, the control unit of the ultrasonic motor 1 according to this embodiment will be described with reference to FIG. 11.

As shown in FIG. 11, the control unit 30 includes a signal control unit 50, a longitudinal vibration detection circuit (longitudinal vibration detection unit) 34, and a flexural vibration detection circuit (flexural vibration detection unit) 35.

The signal control unit 50 includes a frequency-setting circuit 31, a driving-pulse generating circuit 32, the drive IC 33, and a vibration-phase comparator circuit 36.

The frequency-setting circuit 31 generates a pulse signal with a required frequency, for example, the resonance frequency, for driving the ultrasonic motor 1 and outputs this pulse signal to the driving-pulse generating circuit 32.

Figure 12:
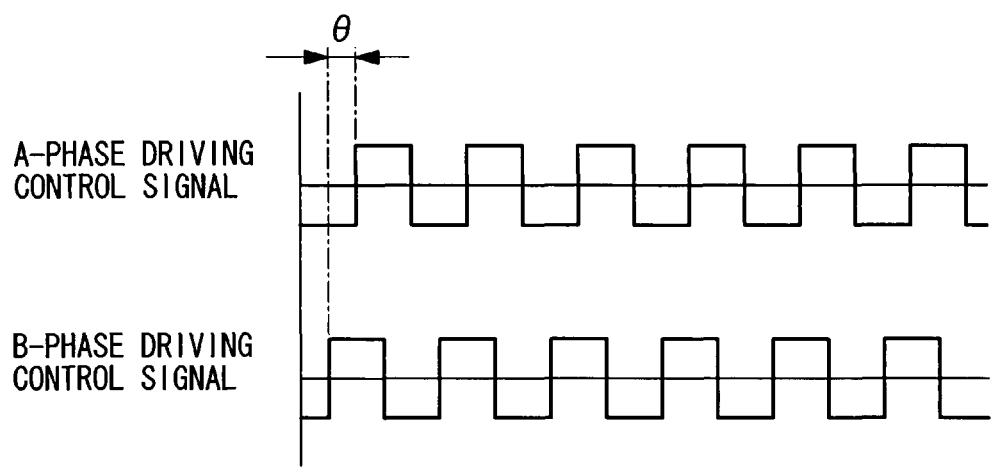
FIG. 12 is a diagram showing two-phase driving control signals generated by a driving-pulse generating circuit.

As shown in FIG. 12, the driving-pulse generating circuit 32 uses the pulse signal input from the frequency-setting circuit 31 to generate two-phase driving control signals with prescribed driving frequencies and a prescribed phase difference (hereinafter referred to as "driving phase difference") θ and outputs them to the drive IC 33. The prescribed phase difference θ is, for example, about 120 degrees.

Based on the two-phase driving control signals input from the driving-pulse generating circuit 31, the drive IC 33 generates two-phase driving AC voltages having a prescribed phase difference and prescribed driving frequencies, and applies each driving AC signal to the A-phase external electrodes 17(A+, A−) and the B-phase external electrodes 17(B+, B−).

The longitudinal vibration detection circuit 34, which is connected to the pair of wiring lines L1 that are connected to the external electrodes 17(C+, C−) shown in FIG. 2, as described above, generates a vibration detection signal that is proportional to the longitudinal vibration generated in the ultrasonic vibrator 3. More specifically, the electrical signals input via the wiring lines L1 are subjected to various types of signal processing, such as level adjustment, noise removal, and binarization, and are converted to a digital signal, and then the processed digital signal is output as a longitudinal vibration detection signal.

The flexural vibration detection circuit 35, which is connected to the pair of wiring lines L2, as described above, generates a vibration detection signal that is proportional to the flexural vibration generated in the ultrasonic vibrator 3. More specifically, the electrical signals input via the wiring lines L2 are subjected to various types of signal processing, such as level adjustment, noise removal, and binarization, and are converted to a digital signal, and then the processed digital signal is output as a flexural vibration detection signal.

The longitudinal vibration detection signal output from the longitudinal vibration detection circuit 34 and the flexural vibration detection signal output from the flexural vibration detection circuit 34 are input to the vibration-phase comparator circuit 36. The vibration-phase comparator circuit 36 determines the phase difference (hereinafter referred to as "vibration phase difference") φ1 between the longitudinal vibration detection signal and the flexural vibration detection signal, determines a difference Δφ1 (=φ1−φ1ref) between this vibration phase difference φ1 and a reference phase difference φ1ref stored in advance, and outputs a signal corresponding to this difference Δφ1.

Figure 13:
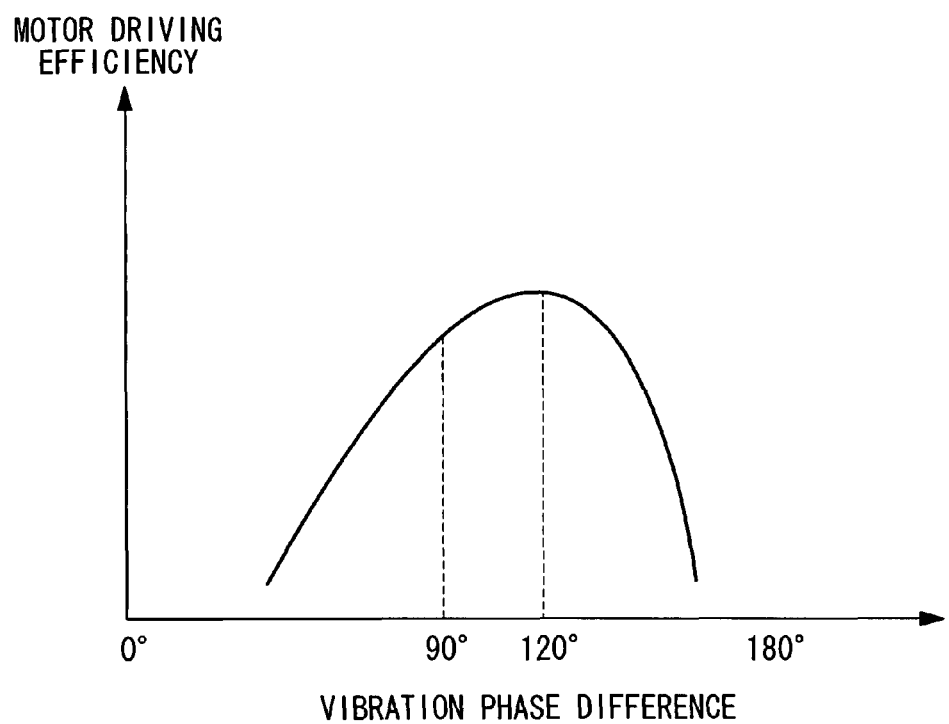
FIG. 13 is a diagram showing the relationship between vibration phase difference and motor efficiency.

The reference phase difference φ1ref described above is a value that can be arbitrarily set, depending on the design, according to the driving efficiency of the ultrasonic motor 1. Here, the relationship between the driving efficiency of the ultrasonic motor and the vibration phase difference φ1 of the ultrasonic vibrator 3 is shown in FIG. 13. As shown in this figure, the driving efficiency of the ultrasonic motor is maximized when the vibration phase difference φ1 is close to 120 degrees, and the driving efficiency gradually decreases as the vibration phase difference φ1 deviates from 120 degrees. In this embodiment, to drive the ultrasonic motor 1 with the optimal efficiency, the reference phase difference φ1ref is set to 120 degrees.

A signal corresponding to the difference Δφ1 output from the vibration-phase comparator circuit 36 is input to the driving-pulse generating circuit 32. The driving-pulse generating circuit 32 adjusts the driving phase difference θ of the two-phase driving control signals so that this difference Δφ1 becomes 0 and outputs the two-phase driving control signals after adjustment. More specifically, the driving-pulse generating circuit 32 increased the driving phase difference θ by a prescribed amount when the difference Δφ1 is a negative value and reduces the driving phase difference θ by a prescribed amount when the difference Δφ1 is a positive value; in other words, it performs sequential control.

A direction indicating signal from a direction indicating circuit 37 is input to the driving-pulse generating circuit 32. The driving-pulse generating circuit 32 reverses the sign of the two-phase driving control signals output to the drive IC 33 according to the direction indicating signal. Accordingly, it is possible to switch the direction of the substantially elliptical vibration generated in the friction-contact members 14 of the ultrasonic vibrator 3 to positive rotation or negative rotation. As a result, it is possible to move the driven body 2 in the positive-rotation direction or the negative-rotation direction.

Next, the operation of the control unit 30 will be described.

Figure 14:
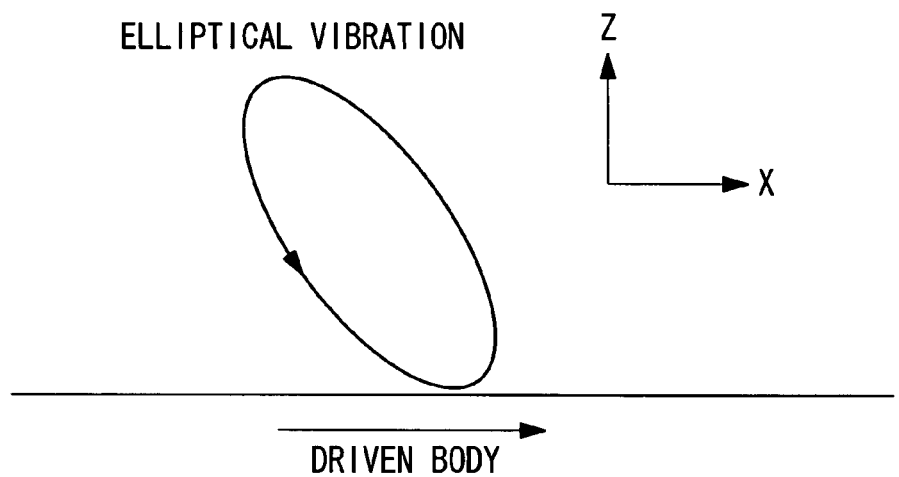
FIG. 14 is a diagram showing an example of a substantially elliptical vibration generated in a friction-contact member when the vibration phase difference is set close to 120 degrees.

First, when the pulse signal with the resonance frequency is input to the driving-pulse generating circuit 32 from the frequency setting circuit 31, two-phase driving control signals with the prescribed driving frequencies and the prescribed driving phase difference θ (=120 degrees) are generated in the driving-pulse generating circuit 32 and output to the drive IC 33. Two-phase driving AC voltages with the prescribed phase difference and the prescribed driving frequencies are generated in the drive IC 33 based on the two-phase driving control signals, and the two-phase driving AC voltages are respectively applied to the A-phase and B-phase external electrodes 17 (A+, A−) and 17 (B+, B−). Accordingly, the longitudinal vibration and the flexural vibration are simultaneously excited in the ultrasonic vibrator 3, the substantially elliptical vibrations, as shown in FIG. 14, are generated at the friction-contact members 14, and the driven body 2 is propelled in the tangential direction of this substantially elliptical vibration by the frictional force generated between the friction-contact members 14 and the sliding plate 8 of the driven body 2.

Thus, when the longitudinal vibration and the flexural vibration are simultaneously excited in the ultrasonic vibrator 3, electrical signals corresponding to the longitudinal vibration are input to the longitudinal vibration detection circuit 34 via the wiring lines L1, and electrical signals corresponding to the flexural vibration in the ultrasonic vibrator 3 are input to the flexural vibration detection circuit 35 via the wiring lines L2. Then, the longitudinal vibration detection signal from the longitudinal vibration detection circuit 34 and the flexural vibration detection signal from the flexural vibration detection circuit 35 are input to the vibration-phase comparator circuit 36.

In the vibration-phase comparator circuit 36, the vibration phase difference φ1 between the longitudinal vibration detection signal and the flexural vibration detection signal is determined, the difference Δφ1 between this vibration phase difference φ1 and the reference phase difference φ1ref is determined, and a signal corresponding to this difference Δφ1 is output to the driving-pulse generating circuit 32.

The driving-pulse generating circuit 32 adjusts the driving phase difference θ of the two-phase driving control signals so that the difference Δφ1 becomes zero.

As described above, with the ultrasonic motor 1 according to this embodiment, the internal electrodes 12(C+) and 12(C−) for detecting the longitudinal vibration are disposed on the piezoelectric ceramic sheets 11 so that, in the first to fourth regions shown in FIG. 8, the surface areas occupied in neighboring regions are substantially the same. Therefore, it is possible to detect only the electrical charges excited by the longitudinal vibration. Thus, it is possible to easily detect only the longitudinal vibration produced in the ultrasonic vibrator 3.

With the ultrasonic motor 1 according to this embodiment, the internal electrodes 12(D+) and 12(E−) and the internal electrodes 12(D−) and 12(E+) are respectively disposed on the piezoelectric ceramic sheets 11 at positions where the total electrical charge due to the longitudinal vibrations is cancelled out and electrical charges proportional to the flexural vibration are excited. Therefore, it is possible to detect only the electrical charges excited by the flexural vibration. Accordingly, it is possible to easily detect only the flexural vibration produced in the ultrasonic vibrator 3.

With the ultrasonic motor 1 according to this embodiment, the longitudinal vibration and the flexural vibration are detected, the vibration phase difference $\phi 1$ therebetween is determined, and the driving phase difference $\theta$ of the two-phase driving AC voltages is controlled so that this vibration phase difference $\phi 1$ becomes equal to the reference phase difference $\phi 1$ref. Therefore, it is possible to always maintain the vibration phase difference $\phi 1$ between the longitudinal vibration and the flexural vibration excited in the ultrasonic vibrator 3 at a desired value (for example, 120 degrees). Accordingly, it is possible to maintain a constant motor driving efficiency, which allows stable motor driving to be realized.

In the embodiment described above, the driving-pulse generating circuit 32 performs sequential control according to the difference $\Delta\phi 1$ input from the vibration-phase comparator circuit 36. However, instead of this, for example, by storing a vibration phase difference $\phi 1$ versus driving phase difference $\theta$ characteristic table, as shown in FIG. 15, and using this characteristic table, the driving-pulse generating circuit 32 may obtain the driving phase difference $\theta$ corresponding to the vibration phase difference $\phi 1$ and generate two-phase driving control signals with this driving phase difference $\theta$.

More specifically, when the vibration-phase comparator circuit 36 determines the vibration phase difference $\phi 1$ between the longitudinal vibration detection signal and the flexural vibration detection signal, it outputs a signal corresponding to this vibration phase difference $\phi 1$ to the driving-pulse generating circuit 32. The driving-pulse generating circuit 32 then obtains the driving phase difference $\theta$ corresponding to the input phase difference $\phi 1$ by referring to the characteristic table shown in FIG. 15 and generates and outputs the two-phase driving control signals having the driving phase difference $\theta$.

With this configuration, even if sudden vibration changes occur due to, for example, some disturbance, causing the vibration phase difference $\phi 1$ to shift significantly from the reference phase difference $\phi 1$ref, it is possible to quickly determine the driving phase difference $\theta$ according to the amount of such a shift. Thus, it is possible to quickly adjust for a sudden change in vibration, which allows the responsiveness to be improved.

Figure 15:
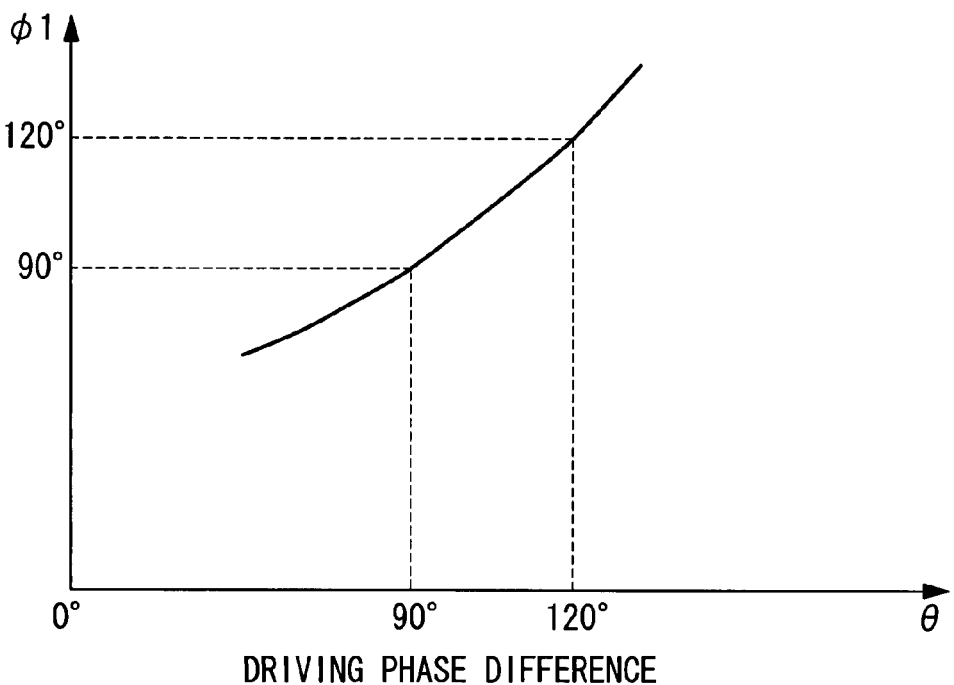
FIG. 15 is a diagram showing the relationship between driving phase difference and vibration phase difference.

It is also possible to determine the driving phase difference $\theta$ corresponding to the vibration phase difference $\phi 1$ by using a numerical formula in which the vibration phase difference $\phi 1$ is defined as a parameter, instead of the vibration phase difference $\phi 1$ versus driving phase difference $\theta$ characteristic table shown in FIG. 15.

In this embodiment, the reference phase difference $\phi 1$ref is defined as 120 degrees, but a plurality of reference phase differences $\phi 1$ref may be set according to the desired motor efficiency, and the reference phase difference $\phi 1$ref may be changed according to the operating state of the motor. It is also possible to change the reference phase difference $\phi 1$ref according to the direction of motion of the driven body 2. For example, when the driven body 2 is to be moved in the direction shown in FIG. 14, the motor efficiency is maximized when the vibration phase difference is 120 degrees, but when the direction of motion of the driven body 2 is in the opposite direction, the motor efficiency is maximized at a different vibration phase difference (for example, 60 degrees). Therefore, in this case, the reference phase difference $\phi 1$ref may be set to 60 degrees.

Second Embodiment

Next, an ultrasonic motor according to a second embodiment of the present invention will be described.

The ultrasonic motor according to this embodiment differs from that in the first embodiment described above in that the control unit thereof further includes a frequency follower function. In describing the ultrasonic motor of this embodiment, a description of aspects that are the same as those in the first embodiment is omitted, and the differences are mainly described.

Figure 16:
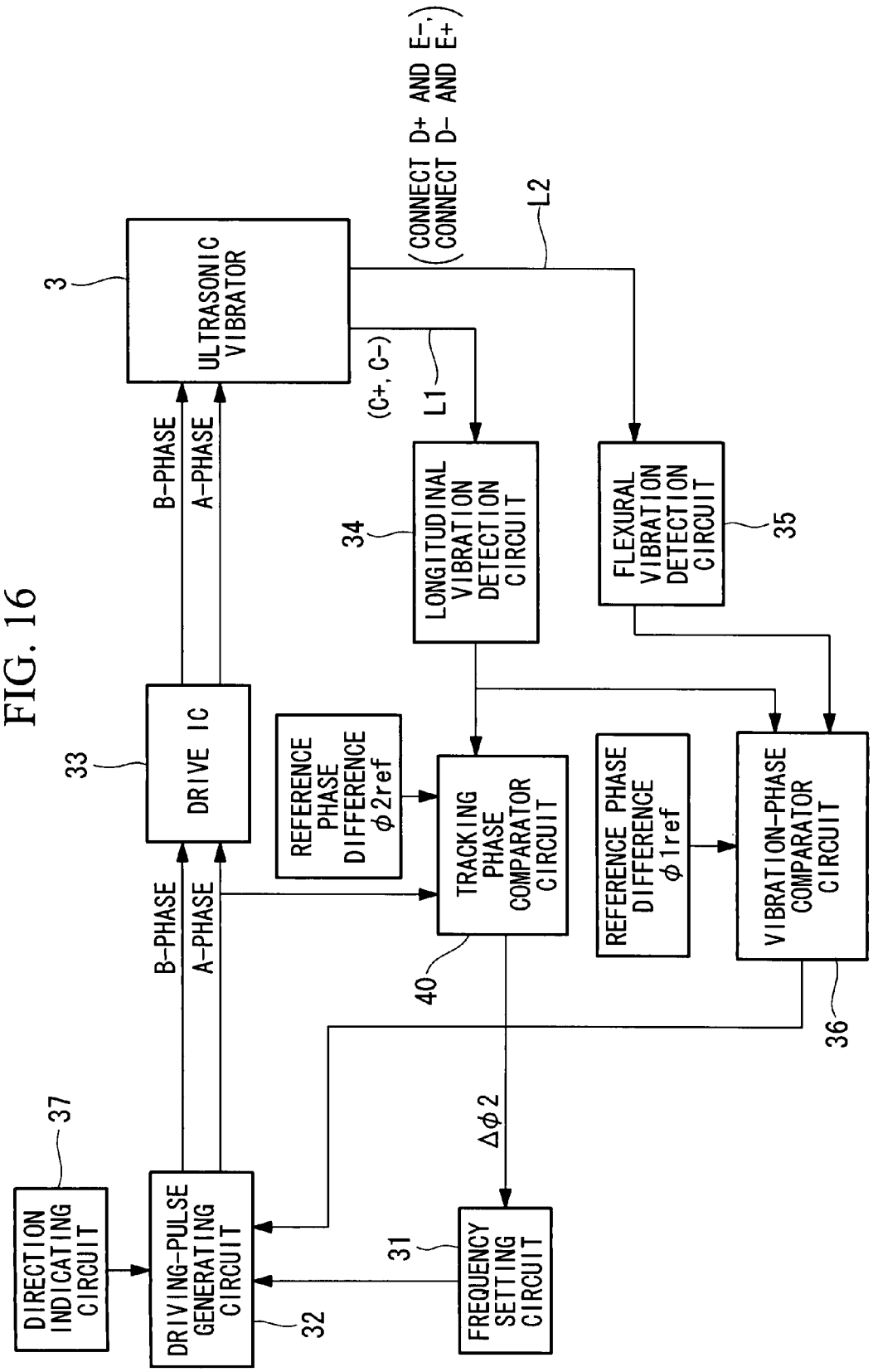
FIG. 16 is a block diagram showing, in outline, the configuration of a control unit according to a second embodiment of the present invention.

As shown in FIG. 16, the ultrasonic motor according to this embodiment includes a tracking phase comparator circuit 40. The longitudinal vibration detection signal output from the longitudinal vibration detection circuit 34 and the A-phase driving control signal output from the driving-pulse generating circuit 32 are input to the tracking phase comparator circuit 40. The tracking phase comparator circuit 40 then determines a phase difference $\phi 2$ between the longitudinal vibration detection signal and the A-phase driving control signal, determines a difference $\Delta\phi 2$ (=$\phi 2$−$\phi 2$ref) between this phase difference $\phi 2$ and a reference phase difference (second reference phase difference) $\phi 2$ref that is stored in advance, and outputs a signal corresponding to this difference $\Delta 100$ 2.

Figure 17:
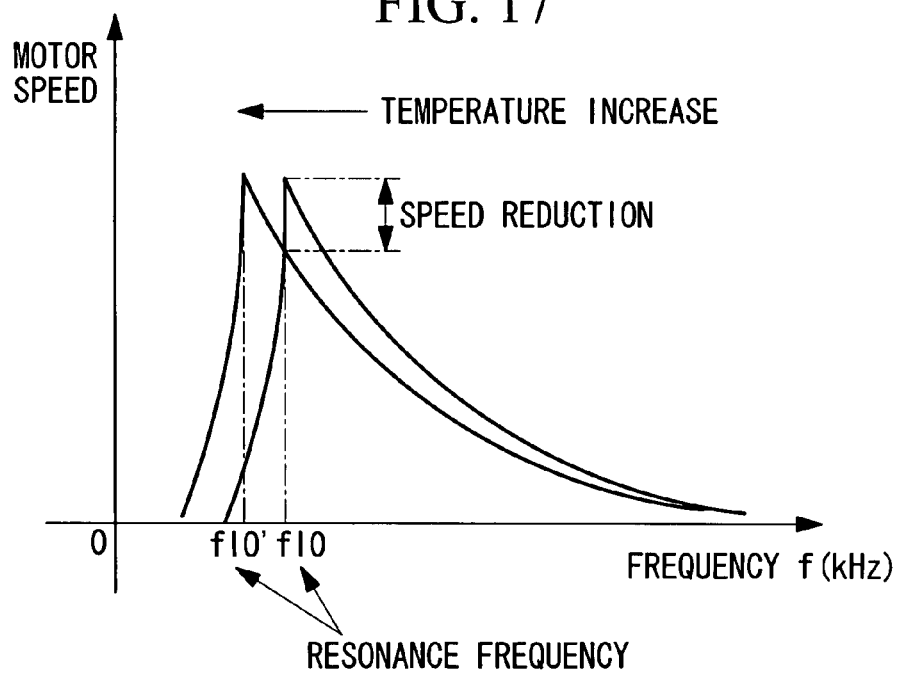
FIG. 17 is a diagram showing the relationship between frequency and motor speed for the longitudinal vibration.

An ultrasonic motor is known to have good efficiency when driven at the resonance frequency. However, the resonance frequency changes depending on the environmental temperature. More specifically, as shown in FIG. 17, it has a characteristic whereby the resonance frequency decreases as the environmental temperature increases. Therefore, when controlling the ultrasonic motor 1 to obtain the maximum motor speed, it is necessary to change the resonance frequency to follow the changes in temperature.

Figure 18:
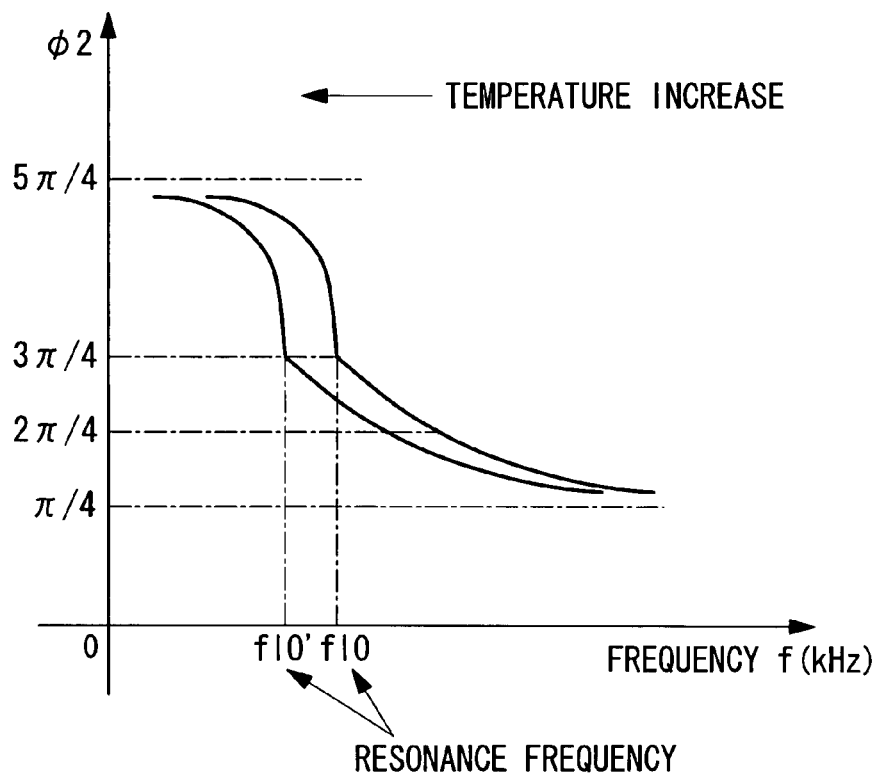
FIG. 18 is a diagram showing a phase difference versus frequency characteristic for the longitudinal vibration.

In contrast, as shown in FIG. 18, the relationship between the resonance frequency and the phase difference $\phi 2$ between the longitudinal vibration detection signal and the A-phase driving control signal is such that the phase difference $\phi 2$ always remains constant even if the resonance frequency changes when the temperature is increased. This indicates that a constant motor speed can always be obtained if the resonance frequency is controlled so that the phase difference $\phi 2$ between the longitudinal vibration detection signal and the A-phase driving control signal is always constant. Thus, in this embodiment, as described above, the resonance frequency is controlled so that the phase difference $\phi 2$ between the A-phase driving control signal and the longitudinal vibration detection signal is always a constant value.

In this embodiment, the reference phase difference $\phi 2$ref is set to $3\pi/4$, and the resonance frequency is controlled so that the phase difference $\phi 2$ between the A-phase driving control signal and the longitudinal vibration detection signal is always the reference phase difference $3\pi/4$. The reason is because, when the reference phase difference is $3\pi/4$, it is possible to drive the ultrasonic motor in the region where the efficiency is optimal, as shown in FIG. 17. The value of the reference phase difference $\phi 2$ref is not particularly limited, however; it is possible to set it arbitrarily based on the design, according to the driving efficiency of the ultrasonic motor 1, in other words, the desired motor speed.

Returning to FIG. 16, the difference Δφ2 from the tracking phase comparator circuit 40 is input to the frequency setting circuit 31. Based on the difference Δφ2, the frequency setting circuit 31 adjusts the frequency of the pulse signal so that the difference Δφ2 becomes zero. More specifically, the frequency setting circuit 31 generates a pulse signal whose frequency is increased by a prescribed amount when the difference Δφ2 is a positive value, generates a pulse signal whose frequency is reduced by a prescribed amount when the difference Δφ2 is a negative value, and outputs the pulse signal to the driving-pulse generating circuit 32. Thus, in this embodiment, the frequency setting circuit 31 realizes sequential frequency control based on the difference Δφ2.

With the ultrasonic motor according to this embodiment, as described above, the driving phase difference θ of the two-phase driving AC voltages is adjusted based on the vibration phase difference φ1, and the frequencies of the driving AC voltages are adjusted based on the phase difference φ2 between the longitudinal detection signal and the A-phase driving control signal. Therefore, even if the environmental temperature changes, it is possible to always keep the motor speed constant. Accordingly, it is possible to realize more stable motor driving.

In the embodiment described above, the frequency setting circuit 31 performs sequential control based on the difference Δφ2 output from the tracking phase comparator circuit 40. Instead of this, for example, the frequency setting circuit 31 may store a characteristic table indicating the relationship between the frequency f and the phase difference φ2 between the A-phase driving control signal and the longitudinal vibration detection signal, as shown in FIG. 19, and may determine the frequency f corresponding to the phase difference φ2 by using this characteristic table.

More specifically, once the tracking phase comparator circuit 40 determines the phase difference φ2 between the A-phase driving control signal and the longitudinal vibration detection signal, it outputs a signal corresponding to this phase difference φ2 to the frequency setting circuit 31. The frequency setting circuit 31 then obtains the frequency f corresponding to the input phase difference φ2 by referring to the characteristic table shown in FIG. 19, generates a pulse signal with this frequency f, and outputs it to the driving-pulse generating circuit 32.

With this configuration, even if the phase difference φ2 shifts substantially from the reference phase difference φ2ref due to, for example, a sudden change in temperature, it is possible to quickly determine the frequency f corresponding to the amount of this shift. Accordingly, it is possible to quickly follow sudden changes in temperature, and the responsiveness can be improved.

Figure 19:
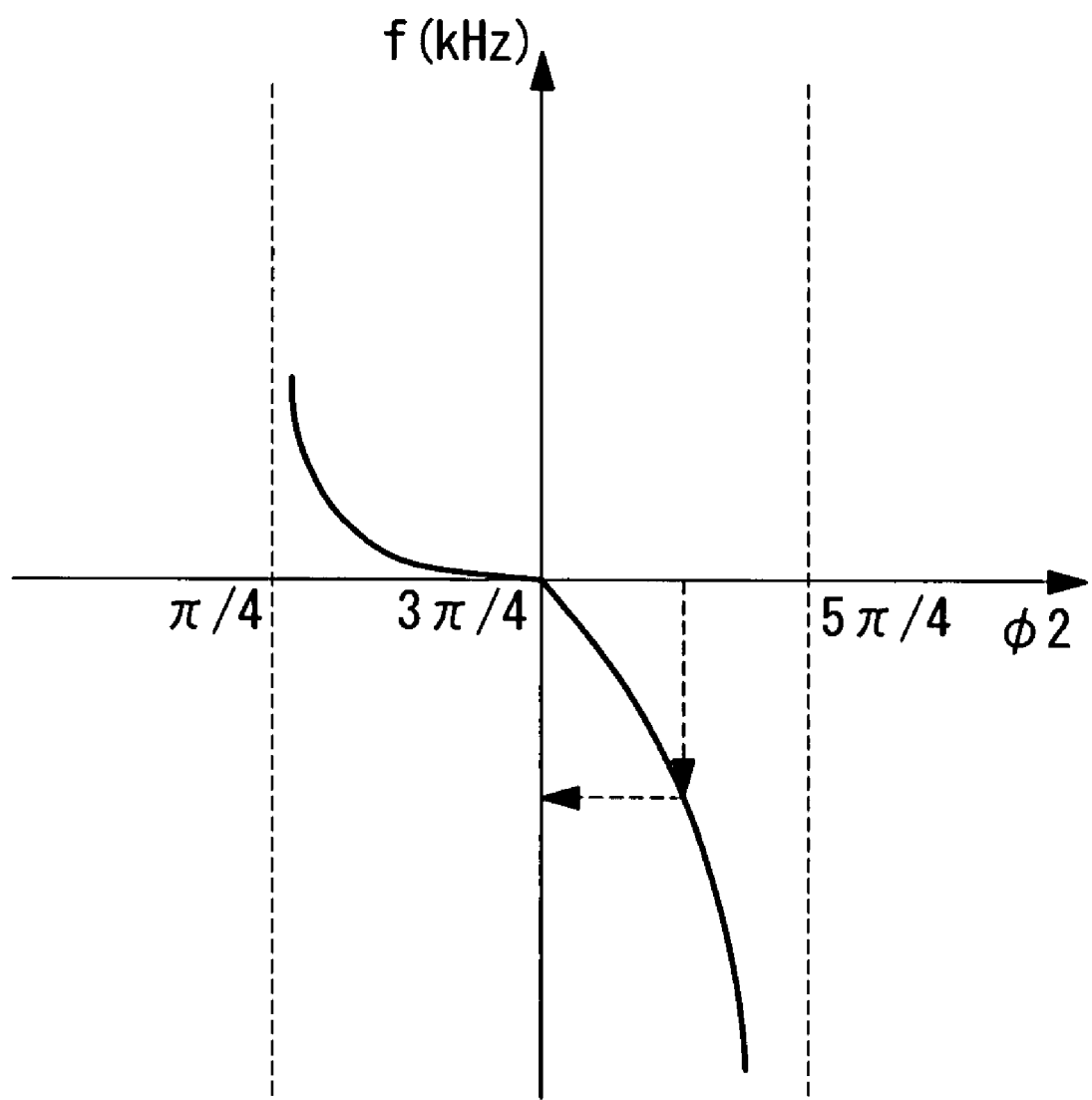
FIG. 19 is a diagram showing an example of a frequency f versus phase difference φ characteristic table which a frequency setting circuit stores.

Instead of the frequency f versus phase difference φ2 characteristic table shown in FIG. 19, the frequency f corresponding to the phase difference φ2 may be determined by using a numerical formula in which the phase difference φ2 is defined as a parameter.

In this embodiment, the A-phase driving control signal and the longitudinal vibration detection signal are compared; however, it is also possible to use the B-phase driving control signal instead of the A-phase driving control signal. In such a case, it is necessary to change the reference phase difference φ2ref according to the phase difference θ between the A-phase driving control signal and the B-phase driving control signal. Furthermore, instead of a two-phase driving control signal, it is possible to use one of the two-phase driving AC voltages applied to the ultrasonic motor 1 from the drive IC 33.

Instead of the longitudinal vibration detection signal, it is possible to use the flexural vibration detection signal. In this case too, it is necessary to change the reference phase difference φ2ref according to the phase difference (in this embodiment, 120 degrees) between the longitudinal vibration detection signal and the flexural vibration detection signal.

Third Embodiment

Next, an ultrasonic motor according to a third embodiment of the present invention will be described.

In the ultrasonic motor according to the first embodiment described above, internal electrodes for detecting the longitudinal vibration and internal electrodes for detecting the flexural vibration are respectively provided. In this embodiment, however, the longitudinal vibration and the flexural vibration are detected using a signal obtained from the same internal electrodes.

In describing the ultrasonic motor of this embodiment, a description of aspects that are the same as those in the first embodiment is omitted, and the differences are mainly described.

Figure 20:
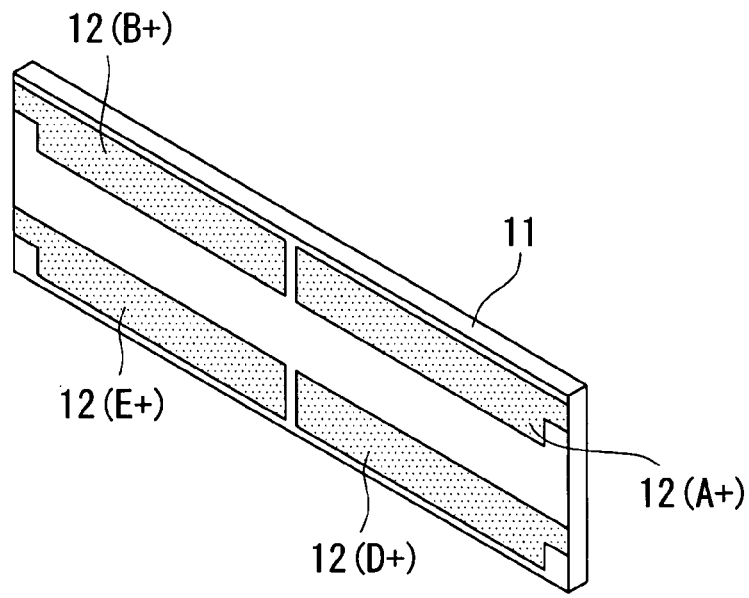
FIG. 20 is a diagram for explaining the placement of vibration-detection internal electrodes according to a third embodiment of the present invention.
Figure 21:
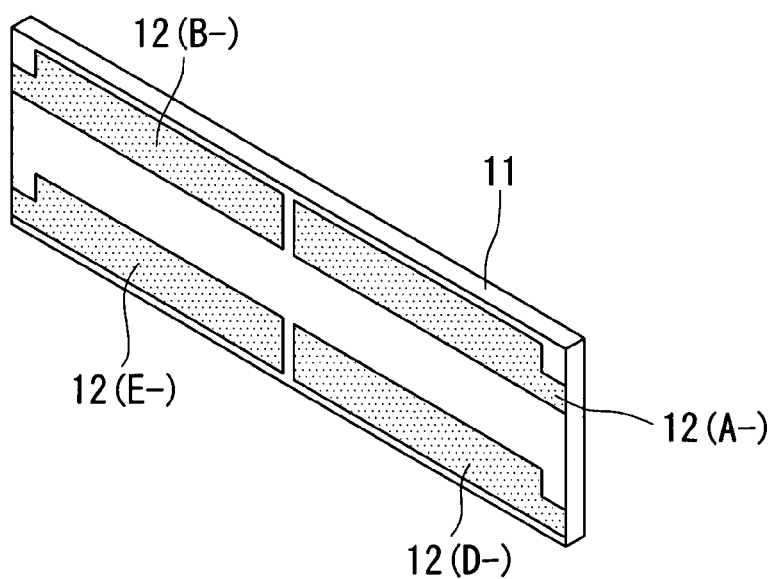
FIG. 21 is a diagram for explaining the placement of vibration-detection internal electrodes according to the third embodiment of the present invention.

FIG. 20 and FIG. 21 are diagrams showing the placement of internal electrodes on piezoelectric ceramic sheets 11 according to this embodiment. FIG. 22 is a diagram showing a piezoelectric layered member 73 fabricated by alternately laminating the piezoelectric ceramic sheets 11 shown in FIG. 20 and FIG. 21. As shown in FIGS. 20 and 21, the piezoelectric ceramic sheets 11 according to this embodiment are configured such that the internal electrodes 12(C+) and 12(C−) according to the first embodiment are eliminated. In other words, in this embodiment, the longitudinal vibration and the flexural vibration are detected using the internal electrodes 12(D+), 12(D−), 12(E+), and 12(E−).

Figure 23:
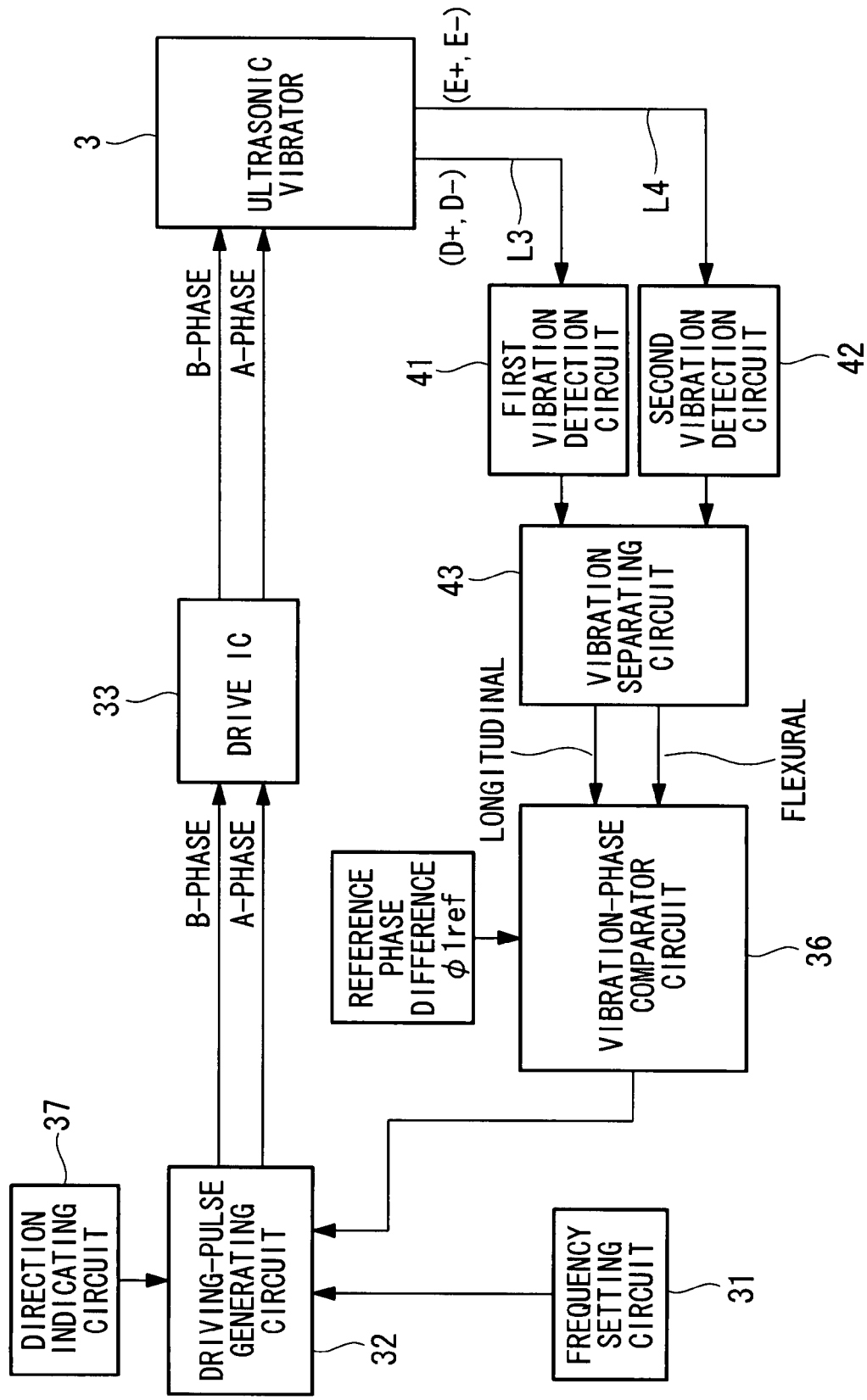
FIG. 23 is a block diagram showing, in outline, the configuration of a control unit according to the third embodiment of the present invention.

More specifically, as shown in FIG. 23, a pair of wiring lines L3 respectively connected to the D-phase external electrodes 17(D+) and 17(D−) are connected to a first vibration detection circuit (first vibration detection unit) 41, and a pair of wiring lines L4 respectively connected to the E-phase external electrodes 17(E+) and 17(E−) are connected to a second vibration detection circuit (second vibration detection unit) 42.

The first vibration detection circuit 41 performs noise removal on the electrical signals input via the wiring lines L3, and outputs the resulting signal to a vibration separating circuit (third vibration detection unit) 43 as a first vibration detection signal.

The second vibration detection circuit 42 performs noise removal on the electrical signals input via the wiring lines L4, and outputs the resulting signal to the vibration separating circuit 43 as a second vibration detection signal.

When the first vibration detection signal and the second vibration detection signal are input to the vibration separating circuit 43, it obtains a longitudinal vibration detection signal by summing these signals and obtains a flexural vibration detection signal by taking the difference between these signals. Then, the longitudinal vibration detection signal and the flexural vibration detection signal are output to the vibration-phase comparator circuit 36.

Here, as shown in FIG. 9 and FIG. 10, in the third region where the internal electrodes 12(D+) and 12(D−) are disposed and the fourth region where the internal electrodes 12(E+) and 12(E−) are disposed, electrical charges of the same sign are excited in the longitudinal vibration, and electrical charges of opposite signs are excited in the flexural vibration.

Therefore, for example, adding the first vibration detection signal detected based on the electrical signals output from the external electrodes 17(D+) and 17(D−) and the second vibration detection signal detected based on the electrical signals output from the external electrodes 17(E+) and 17(E−) corresponds, in effect, to joining the external electrodes 17(D+) and 17(E+) and joining the external electrodes 17(D−) and 17(E−) in the vibration separating circuit 43, and the summed signal cancels out the electrical charges excited by the flexural vibration to zero. As a result, it is possible to obtain only a signal that is proportional to the longitudinal vibration.

Furthermore, taking the difference between the first vibration detection signal detected based on the electrical signals output from the external electrodes 17(D+) and 17(D−) and the second vibration detection signal detected based on the electrical signals output from the external electrodes 17(E+) and 17(E−) corresponds, in effect, to joining the external electrodes 17(D+) and 17(E−) and joining the external electrodes 17(D−) and 17(E+) in the vibration separating circuit 43, and the difference signal cancels out the electrical charges excited by the longitudinal vibration to zero. As a result, it is possible to obtain only a signal that is proportional to the flexural vibration.

As described above, with the ultrasonic motor according to this embodiment, compared to the first embodiment described above, it is possible to reduce the number of internal electrodes for vibration detection and the number of external electrodes, which allows the device to be simplified.

Figure 24:
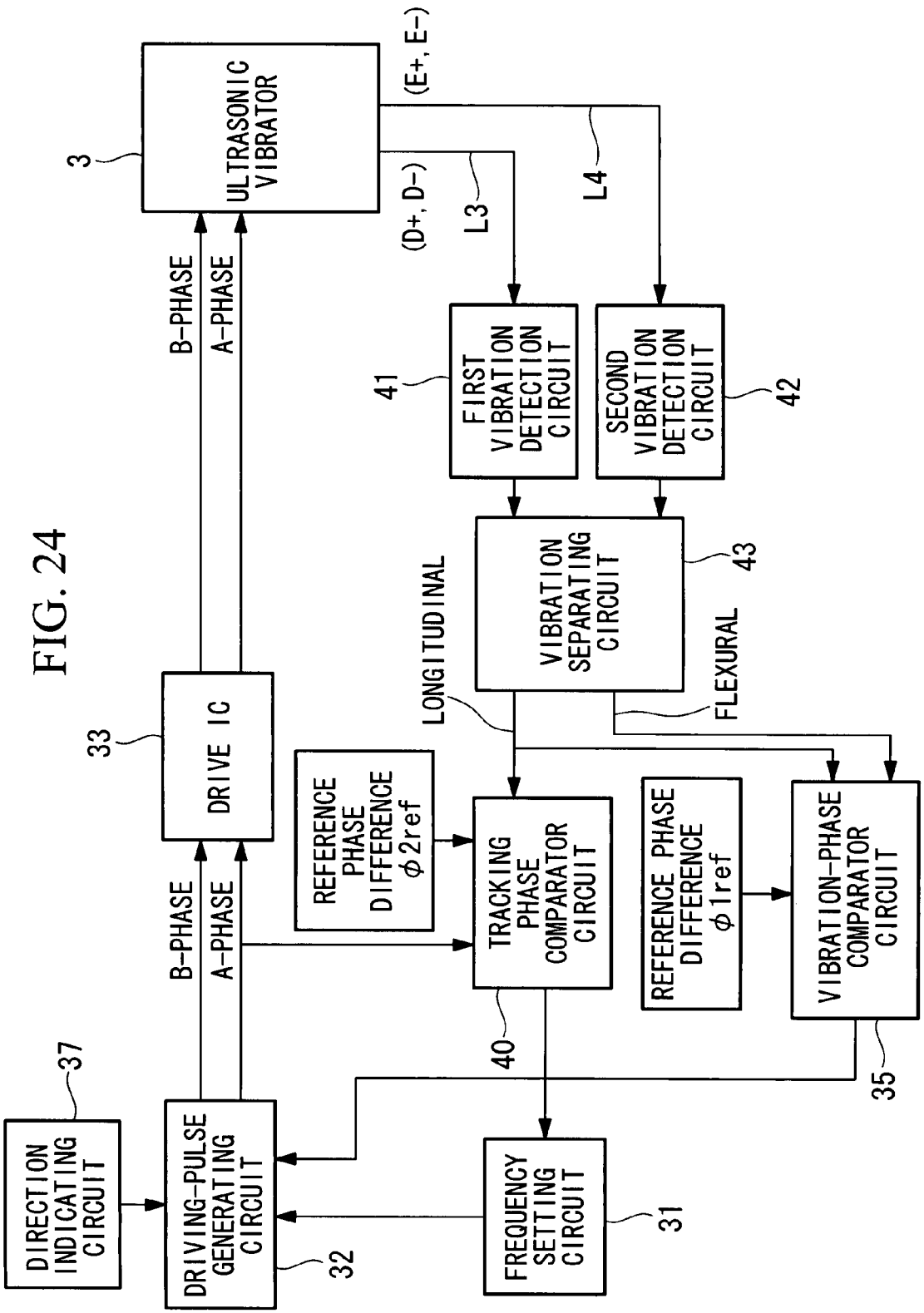
FIG. 24 is a diagram showing a modification of the control unit according to the second embodiment of the present invention.

In the ultrasonic motor according to the second embodiment shown in FIG. 16, the internal electrodes on each piezoelectric ceramic sheet 11 are the same as in the third embodiment described above, and as shown in FIG. 24, instead of the longitudinal vibration detection circuit 34 and the flexural vibration detection circuit 35, it is possible to use the first vibration detection circuit 41, the second vibration detection circuit 42, and the vibration separating circuit 43 according to the third embodiment.

Although embodiments of the present invention have been described with reference to the drawings, the specific structure is not limited to these embodiments. Various design changes and so on may be included so long as they do not depart from the spirit of the invention.

For example, in the embodiments described above, the internal electrodes for vibration detection are provided on all layers. The present invention is not limited to this, however; it is possible to provide them on only one layer or on only a few layers.

What is claimed is:

1. An ultrasonic motor having an ultrasonic vibrator in which a first piezoelectric element and a second piezoelectric element are alternately laminated and a driven body in contact with the ultrasonic vibrator, the ultrasonic motor configured to simultaneously generate a longitudinal vibration and a flexural vibration in the ultrasonic vibrator to generate a substantially elliptical vibration at an output end of the ultrasonic vibrator, thus causing the ultrasonic vibrator and the driven body to move relative to each other, the ultrasonic motor comprising:
    a first internal electrode disposed, when the first piezoelectric element is divided into two equal parts in a longitudinal direction and two equal parts in a width direction to form four regions, in two neighboring regions or in all regions such that the surface areas occupied in each region are substantially the same;
    a second internal electrode disposed on the second piezoelectric element at a position corresponding to the first internal electrode; and
    a longitudinal vibration detection unit configured to detect the longitudinal vibration independently, in the conditions where the longitudinal vibration and the flexural vibration are simultaneously generated, based on a potential difference between the first internal electrode and the second internal electrode.

2. A vibration detection method for an ultrasonic motor configured to simultaneously generate a longitudinal vibration and a flexural vibration in an ultrasonic vibrator in which a first piezoelectric element and a second piezoelectric element are alternately laminated, to generate a substantially elliptical vibration at an output end of the ultrasonic vibrator, thus causing the ultrasonic vibrator and a driven body in contact with the ultrasonic vibrator to move relative to each other, the vibration detection method for the ultrasonic motor comprising:
    disposing, when the first piezoelectric element is divided into two equal parts in a longitudinal direction and two equal parts in a width direction to form four regions, a first internal electrode in two neighboring regions or in all regions such that surface areas occupied in each region are substantially the same;
    disposing a second internal electrode on the second piezoelectric element at a position corresponding to the first internal electrode; and
    detecting the longitudinal vibration independently, in the conditions where the longitudinal vibration and the flexural vibration are simultaneously generated, based on a potential difference between the first internal electrode and the second internal electrode.

* * * * *